(12) United States Patent
Hur et al.

(10) Patent No.: US 11,643,722 B2
(45) Date of Patent: May 9, 2023

(54) PLASMA CLEANING APPARATUS AND SEMICONDUCTOR PROCESS EQUIPMENT WITH THE SAME

(71) Applicant: KOREA INSTITUTE OF MACHINERY & MATERIALS, Daejeon (KR)

(72) Inventors: Min Hur, Daejeon (KR); Woo Seok Kang, Daejeon (KR); Dae-Woong Kim, Daejeon (KR); Jinyoung Lee, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 175 days.

(21) Appl. No.: 17/133,988

(22) Filed: Dec. 24, 2020

(65) Prior Publication Data

US 2021/0198786 A1    Jul. 1, 2021

(30) Foreign Application Priority Data

Dec. 27, 2019  (KR) .................. 10-2019-0176950

(51) Int. Cl.
  *C23C 16/44*    (2006.01)
  *H01L 21/67*    (2006.01)
  (Continued)

(52) U.S. Cl.
  CPC ............ *C23C 16/4405* (2013.01); *B08B 5/00* (2013.01); *B08B 7/0035* (2013.01);
  (Continued)

(58) Field of Classification Search
  CPC ................................................. C23C 16/4412
  See application file for complete search history.

(56) References Cited

U.S. PATENT DOCUMENTS 5,827,370 A    10/1998  Gu
6,099,649 A     8/2000  Schmitt et al.
(Continued)

FOREIGN PATENT DOCUMENTS

CN    101528369 A    9/2009
CN    102089848 A    6/2011
(Continued)

OTHER PUBLICATIONS

KR 20150124827, Hur, Nov. 2015 (Year: 2015).*
(Continued)

*Primary Examiner* — Keath T Chen
(74) *Attorney, Agent, or Firm* — Hauptman Ham, LLP

(57) ABSTRACT

A plasma cleaning apparatus includes a metal chamber, a gate assembly, a dielectric, and a high voltage electrode. The metal chamber is connected to a vacuum tube connecting the process chamber and the vacuum pump, and is provided with a first opening. The gate assembly includes a gate support fixed to the metal chamber around the first opening and having a second opening, and a gate coupled to the gate support and having a first position closing the second opening and a second position opening the second opening switchable with each other. The dielectric is coupled to the outside of the gate support around the second opening, and the high voltage electrode is positioned on an outer surface of the dielectric.

5 Claims, 30 Drawing Sheets

(51) Int. Cl.
*B08B 5/00* (2006.01)
*B08B 7/00* (2006.01)
*H01J 37/32* (2006.01)

(52) U.S. Cl.
CPC ...... *C23C 16/4412* (2013.01); *H01J 37/3288* (2013.01); *H01J 37/32862* (2013.01); *H01L 21/67017* (2013.01)

(56) References Cited

U.S. PATENT DOCUMENTS

| | | | |
|---|---|---|---|
| 6,238,514 B1 | 5/2001 | Gu | |
| 6,517,592 B2 | 2/2003 | Umotoy et al. | |
| 7,491,292 B2 | 2/2009 | Han et al. | |
| 7,988,755 B2 | 8/2011 | Cho et al. | |
| 8,404,028 B2 | 5/2013 | Easton et al. | |
| 9,314,824 B2 | 4/2016 | Gu et al. | |
| 9,472,381 B2 | 10/2016 | Hur et al. | |
| 2002/0185067 A1* | 12/2002 | Upham | B08B 7/0035 134/1.1 |
| 2006/0276049 A1 | 12/2006 | Bailey et al. | |
| 2012/0312256 A1* | 12/2012 | Komurian | F16K 11/044 123/41.44 |
| 2022/0068610 A1* | 3/2022 | Schüngel | C23C 14/505 |

FOREIGN PATENT DOCUMENTS

| | | |
|---|---|---|
| CN | 102737948 A | 10/2012 |
| CN | 105047515 A | 11/2015 |
| CN | 109119320 A | 1/2019 |
| CN | 110863989 A | 3/2020 |
| EP | 1 568 797 A2 | 8/2005 |
| KR | 10-0558562 B1 | 3/2006 |
| KR | 10-0647725 B1 | 11/2006 |
| KR | 10-0806271 B1 | 2/2008 |
| KR | 10-1024504 B1 | 3/2011 |
| KR | 10-1434815 B1 | 8/2014 |
| KR | 10-1512159 B1 | 4/2015 |
| KR | 10-2015-0124827 A | 11/2015 |
| KR | 10-1642129 B1 | 7/2016 |
| KR | 10-2016-0116522 A | 10/2016 |
| KR | 10-1703993 B1 | 2/2017 |
| KR | 10-2019-0092092 A | 8/2019 |
| KR | 10-2023705 B1 | 9/2019 |

OTHER PUBLICATIONS

Zhang, "The Application and Technology Research of Plasma Cleaning," Equipment for Electronic Products Manufacturing, Jun. 15, 2006, pp. 21-27; along with English abstract.
Korean Office Action dated Apr. 29, 2021, in connection with the Korean Patent Application No. 10-2019-0176950.

* cited by examiner

PLASMA CLEANING APPARATUS AND SEMICONDUCTOR PROCESS EQUIPMENT WITH THE SAME

CROSS-REFERENCE TO RELATED APPLICATION

This application claims priority to and the benefit of Korean Patent Application No. 10-2019-0176950 filed in the Korean Intellectual Property Office on Dec. 27, 2019, the entire contents of which are incorporated herein by reference.

BACKGROUND OF THE INVENTION

(a) Field of the Invention

The present invention relates to a plasma cleaning apparatus. More particularly, the present invention relates to a plasma cleaning apparatus that may increase a useful lifespan of a vacuum tube and a vacuum pump.

(b) Description of the Related Art

A semiconductor process is a process of manufacturing a semiconductor chip of a specific pattern by repeatedly performing processes of depositing a thin film on a wafer in a process chamber and of selectively etching the deposited thin film. In this case, the process chamber is connected to a vacuum pump by a vacuum tube such that the inside thereof is evacuated.

The process gas discharged from the process chamber contains undecomposed precursors and process by-products, which accumulate in the vacuum tube and vacuum pump over time to shorten their lifespan. Moreover, due to recent refined process, as an amount of precursor used increases, a replacement cycle of the vacuum tube and the vacuum pump is being shortened.

A plasma cleaning apparatus is known in which plasma is generated at a specific portion of a vacuum tube to generate fluorine radicals or chlorine radicals from cleaning gas, and then undecomposed precursors and process by-products accumulated in the vacuum tube and vacuum pump are gasified by using these radicals. In the known plasma cleaning apparatus, a high voltage electrode is applied with an alternating current (AC) or high frequency (RF) voltage, and it is protected by a dielectric.

The known plasma cleaning apparatus may be operated in a method of turning off plasma in a section (deposition section) in which a precursor is injected into the process chamber, turning on plasma in a section (cleaning section) in which a cleaning gas is injected into the process chamber, and then cleaning the plasma.

In this case, metal components among undecomposed precursors and process by-products may be applied to an inner wall of the dielectric in an irregular shape, and contamination of the dielectric causes arcing and unstable plasma generation. The arcing leads to dielectric breakdown, and the unstable plasma generation leads to a reduction in cleaning effect.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a plasma cleaning apparatus and semiconductor process equipment with the same that may minimizes contamination of a dielectric to suppress arcing and unstable plasma generation, and as a result, to improve a plasma cleaning effect while preventing dielectric breakdown.

A plasma cleaning apparatus according to an embodiment of the present invention includes a metal chamber, a gate assembly, a dielectric, and a high voltage electrode. The metal chamber is connected to a vacuum tube connecting the process chamber and the vacuum pump, and is provided with a first opening. The gate assembly includes a gate support fixed around the first opening of the metal chamber and having a second opening, and a gate coupled to the gate support and having a first position closing the second opening and a second position opening the second opening switchable with each other. The dielectric is coupled to the outside of the gate support around the second opening, and the high voltage electrode is positioned on an outer surface of the dielectric. When the gate is at the second position, a driving voltage is applied to the high voltage electrode such that plasma cleaning is performed.

The gate support may be a plate-shaped member in which the second opening is positioned at a center thereof. The gate may include a gate plate positioned inside the gate support, a plurality of transfer rods fixed to the gate plate and penetrating the gate support, and an actuator coupled to at least one of the plurality of transfer rods.

The gate plate may be larger than the second opening, the plurality of transfer rods may maintain a sealed state with respect to the gate support, and the gate assembly may be grounded so that the gate plate functions as a ground electrode at the second position. The dielectric may include a tubular first dielectric fixed to the gate support, and a plate-shaped second dielectric blocking an end portion of the first dielectric. The high voltage electrode may be a tubular member surrounding the first dielectric.

The plasma cleaning apparatus may include a mesh plate positioned at an edge of the second dielectric at a predetermined distance from the first dielectric, a dielectric cover surrounding the mesh plate and the second dielectric at a predetermined distance therefrom, and a cleaning gas injection pipe coupled to the dielectric cover.

The dielectric may be configured of a pair of quadrangular plates facing each other, and the pair of dielectrics may form a quadrangular tube together with a pair of metal supports. End portions of the pair of dielectrics and the pair of metal supports are sealed by a metal cover, and the high voltage electrode may be configured of a quadrangular plate.

The gate support may include a first flange surrounding the second opening and extending outward, the dielectric may be coupled to the first flange, and the dielectric and high voltage electrode may be plate-shaped members.

The plasma cleaning apparatus may further include a dielectric cover closely contacting an end portion of the dielectric while surrounding the first flange at a predetermined distance from the first flange, and a cleaning gas injection pipe coupled to the dielectric cover. At least one third opening passing the cleaning gas may be positioned in the first flange.

The gate support may be a plate-shaped member including a first flange surrounding the second opening and extending outward, the dielectric may be coupled to the first flange, and a ground electrode may be positioned between the first flange and the dielectric. The gate may be coupled to the first flange inside the ground electrode.

The ground electrode may be a tubular member, and the dielectric may be a tubular member with one side opened and the other side blocked. The gate may include a gate plate formed in a plate shape corresponding to the second opening, and an actuator coupled to the gate plate to rotationally or linearly transfer the gate plate.

The ground electrode may be a plate-shaped member provided with at least one fourth opening, and the dielectric may be a tubular member with one side opened and the other side blocked. The gate may include a gate plate formed in a plate shape corresponding to the second opening, a pair of rotating shafts supported by the first flange and coupled to two points of the gate plate facing each other, and an actuator coupled to one of the rotating shafts to rotate the gate plate.

The gate support and the dielectric may be plate-shaped members, and a plate-shaped ground electrode provided with a fifth opening larger than the second opening may be positioned between the metal chamber and the gate support. The gate may be positioned in the fifth opening at the first position, and may be spaced apart from the fifth opening at the second position to open the fifth opening and the second opening.

Semiconductor process equipment includes: a process chamber in which a deposition process proceeds; a vacuum pump that is connected to the process chamber by a vacuum tube and evacuates the inside of the process chamber; and the plasma cleaning apparatus described above that is connected to the vacuum tube, and decomposes cleaning gas into plasma to clean an undecomposed precursor and a process by-product accumulated in the vacuum tube and the vacuum pump.

A plasma cleaning apparatus according to another embodiment of the present invention includes a metal chamber, a trap, a dielectric, a high voltage electrode, and a gate. The metal chamber is connected to a vacuum tube connecting the process chamber and the vacuum pump, and is provided with a first opening. A trap that is positioned in an inner space of the metal chamber is configured of a porous member having a plurality of holes passing process gas, and traps an undecomposed precursor and a process by-product in the process gas. The dielectric is coupled to the outside of the metal chamber around the first opening, and the high voltage electrode is positioned on an outer surface of the dielectric. A gate is installed between the trap and the dielectric inside the metal chamber, and a first position of the gate blocking between the trap and the dielectric and a second position of the gate opening between the trap and the dielectric are switchable with each other. When the gate is at the second position, a driving voltage is applied to the high voltage electrode such that plasma cleaning is performed.

The dielectric and the high voltage electrode may be plate-shaped members, and the trap may include a plurality of porous plates that are continuously arranged along one direction. The gate may include a gate plate positioned to contact one end portion of the plurality of porous plates facing the dielectric, and an actuator moving the gate plate. The trap and gate plate may be grounded to function as a ground electrode at the second position.

The metal chamber may be connected to the inlet vacuum tube at a side wall thereof, and may be connected to the outlet vacuum tube at a lower end center thereof. The trap may include a porous tubular portion fixed to a lower end of the vacuum chamber so that an inner space thereof communicates with the outlet vacuum tube, and a cover plate covering an upper end of the tubular portion.

The first opening may be positioned at an upper end center of the metal chamber, and the metal chamber may include a second flange surrounding the first opening and extending outwardly. The dielectric and the gate may be installed at the second flange, and the gate may include a plate-shaped gate plate corresponding to the first opening and an actuator for moving the gate plate.

Semiconductor process equipment according to another embodiment of the present invention includes a process chamber, a vacuum pump, and a plasma cleaning apparatus. A deposition process proceeds in the process chamber, and the vacuum pump is connected to the process chamber by a vacuum tube to exhaust the inside of the process chamber. The plasma cleaning apparatus is connected to the vacuum tube, includes a trap trapping an undecomposed precursor and a process by-product in process gas, and decomposes cleaning gas into plasma to clean an undecomposed precursor and a process by-product accumulated in the vacuum tube, the vacuum pump, and the trap.

The plasma cleaning apparatus uses the gate when the plasma is turned off so that the inner wall of the dielectric does not communicate with the inner space of the metal chamber. Therefore, when the plasma is turned off, the inner wall of the dielectric does not contact the process gas, so that metal components in the process gas may be prevented from being applied to the inner wall of the dielectric. As a result, the occurrence of arcing is suppressed to prevent dielectric breakdown, and the plasma cleaning effect may be enhanced by maintaining stable plasma.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
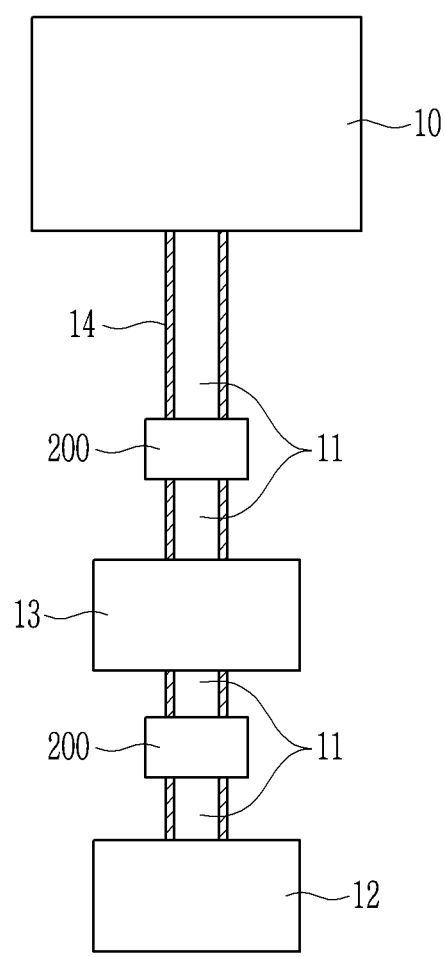
FIG. 1 illustrates a schematic view of semiconductor process equipment according to a first embodiment of the present invention.

FIG. 1 illustrates a schematic view of semiconductor process equipment according to a first embodiment of the present invention.

Referring to FIG. 1, semiconductor process equipment 101 of the first embodiment illustrates a process chamber 10 in which a deposition process is performed, a vacuum pump 12 connected to the process chamber 10 by a vacuum tube 11 and evacuating the inside of the process chamber 10, and a trap apparatus 13 and a plasma cleaning apparatus 200 connected to the vacuum tube 11.

Unresolved precursors and process by-products in a process gas discharged from the process chamber 10 collide with inner elements of the trap apparatus 13 and are trapped thereto and continuously accumulated thereon. The trap device functions to capture the undecomposed precursors and process by-products to reduce an amount of undecomposed precursors and process by-products passed to the vacuum pump.

The deposition process of the process chamber 10 includes a deposition step in which a precursor and a reaction gas are injected to form a thin film, and a purge step of discharging the undecomposed precursor and process by-product remaining in the process chamber 10 out of the process chamber 10. In this case, very small amounts of the undecomposed precursors and process by-products remain attached to the inner wall of the process chamber 10, and a cleaning step is performed after performing the deposition and purge steps several times to remove them.

In the cleaning step, a cleaning gas containing fluorine or chlorine is decomposed into fluorine radicals or chlorine radicals by remote plasma and injected into the process chamber 10, and these radicals convert the undecomposed precursors and process by-products remaining on the inner wall of the process chamber 10 into a gas. However, only a very small amount of the fluorine radicals or chlorine radicals injected into the process chamber 10 is consumed for cleaning the process chamber 10, and most thereof are discharged outside the process chamber 10, and the discharged radicals are recombined by collision with the vacuum tube 11 to become a gas.

The plasma cleaning apparatus 200 decomposes the recombined fluorine or chlorine gas into plasma again to generate fluorine radicals or chlorine radicals having excellent cleaning ability, and it uses these radicals to clean the undecomposed precursors and process by-products accumulated in the vacuum tube 11, the trap apparatus 13, and the vacuum pump 12. The plasma cleaning apparatus 200 may be connected to the process chamber 10 to turn on the plasma in the cleaning step of the process chamber 10.

The plasma cleaning apparatus 200 may have its own cleaning gas injection pipe. In this case, the plasma cleaning apparatus 200 may perform plasma cleaning by decomposing the cleaning gas supplied through the cleaning gas injection pipe into plasma without linking the plasma operation to the process chamber.

The plasma cleaning apparatus 200 may be installed in at least one of a portion of the vacuum tube 11 between the process chamber 10 and the trap apparatus 13 and a portion of the vacuum tube 11 between the trap apparatus 13 and the vacuum pump 12. In FIG. 1, the case in which plasma cleaning apparatuses 200 are installed in two portions of the vacuum tube 11 is illustrated, but the installation location and number of plasma cleaning apparatuses 200 are not limited to the illustrated example.

Meanwhile, when a temperature of the vacuum tube 11 is low, the undecomposed precursor causes a phase change to a liquid, and sticks to the vacuum tube 11 and the vacuum pump 12 together with the process by-product to shorten their lifespans. A heater 14 may be configured of a heating tape and the like attached to an outer wall of the vacuum tube 11, and it may increase the temperature of the vacuum tube 11 to suppress the undecomposed precursor from having a phase change into a liquid in a region in which the plasma cleaning effect is weak.

The semiconductor process equipment 101 may effectively clean the undecomposed precursors and process by-products accumulated in the vacuum tube 11, the trap apparatus 13, and the vacuum pump 12 by the plasma cleaning apparatus 200 to increase their service lifespan, and as a result, it may increase the semiconductor process efficiency. The plasma cleaning apparatus 200 includes one of the plasma cleaning apparatuses of first to ninth embodiments described below.

Figure 2:
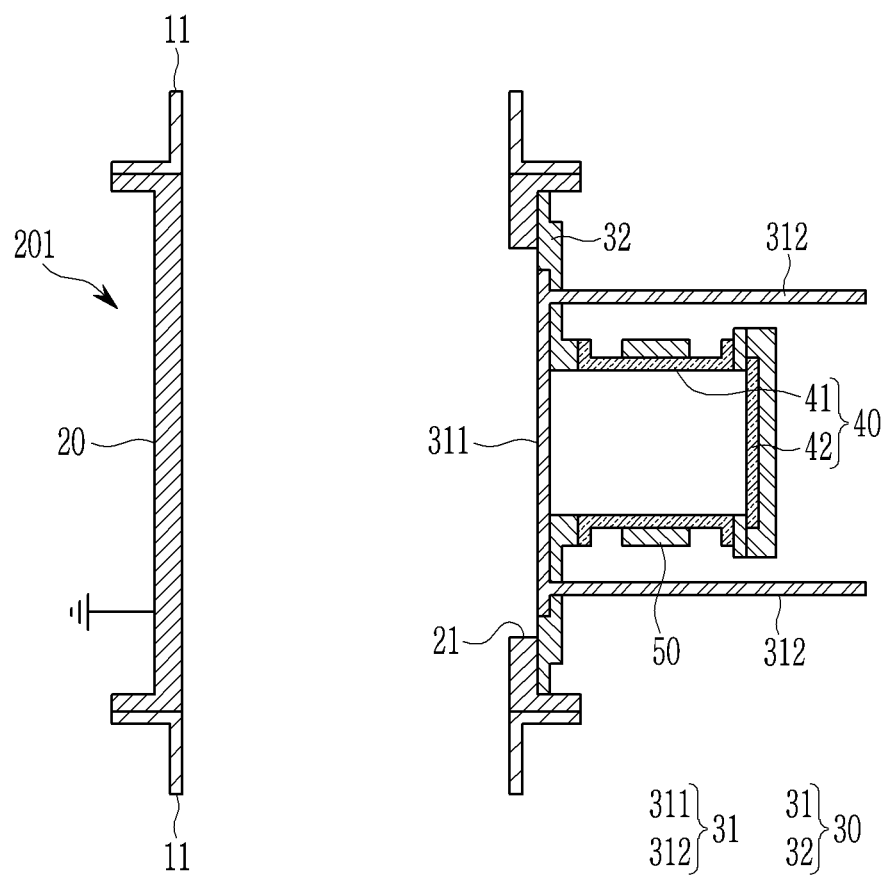
FIG. 2, FIG. 3, and FIG. 6 illustrate cross-sectional views of a plasma cleaning apparatus according to a first embodiment.
Figure 3:
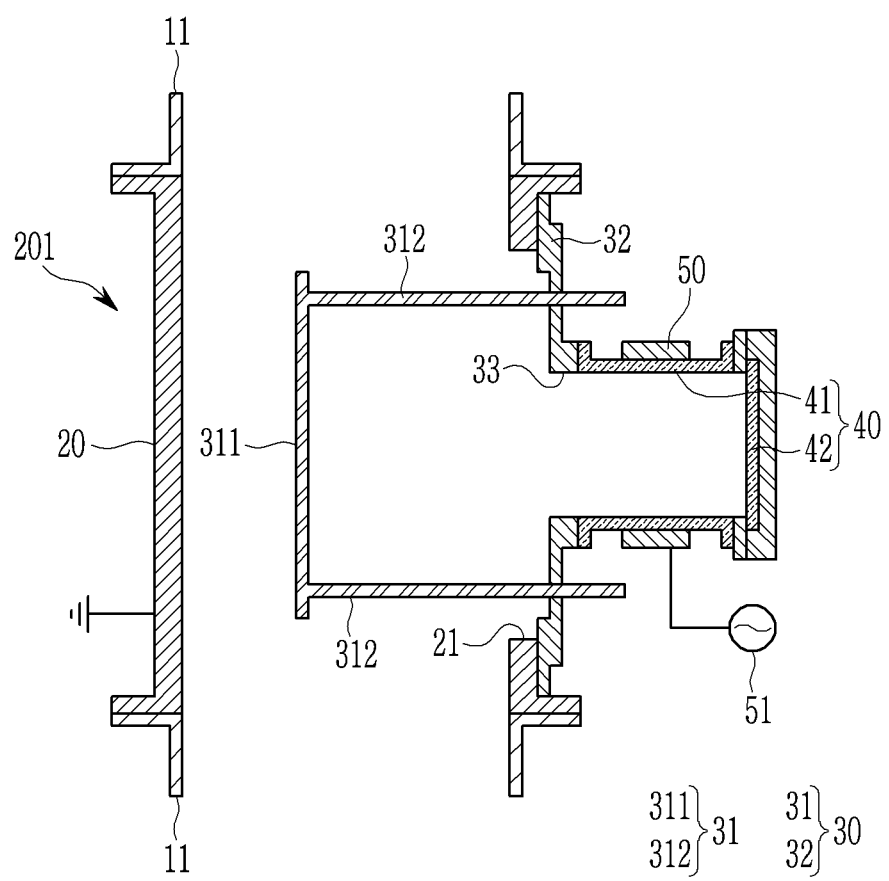
Figure 4:
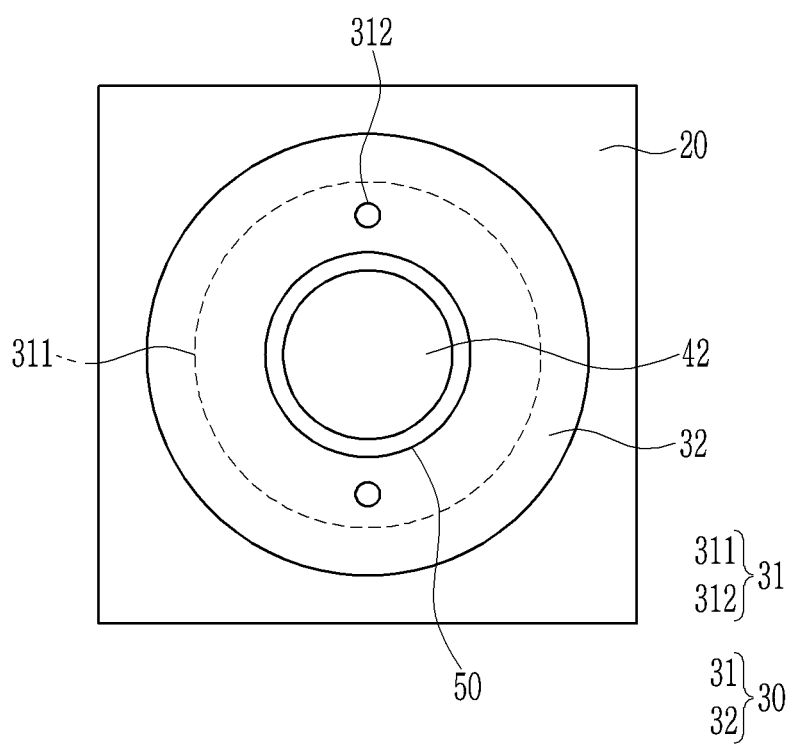
FIG. 4 illustrates a right side view of the plasma cleaning apparatus shown in FIG. 2.
Figure 5:
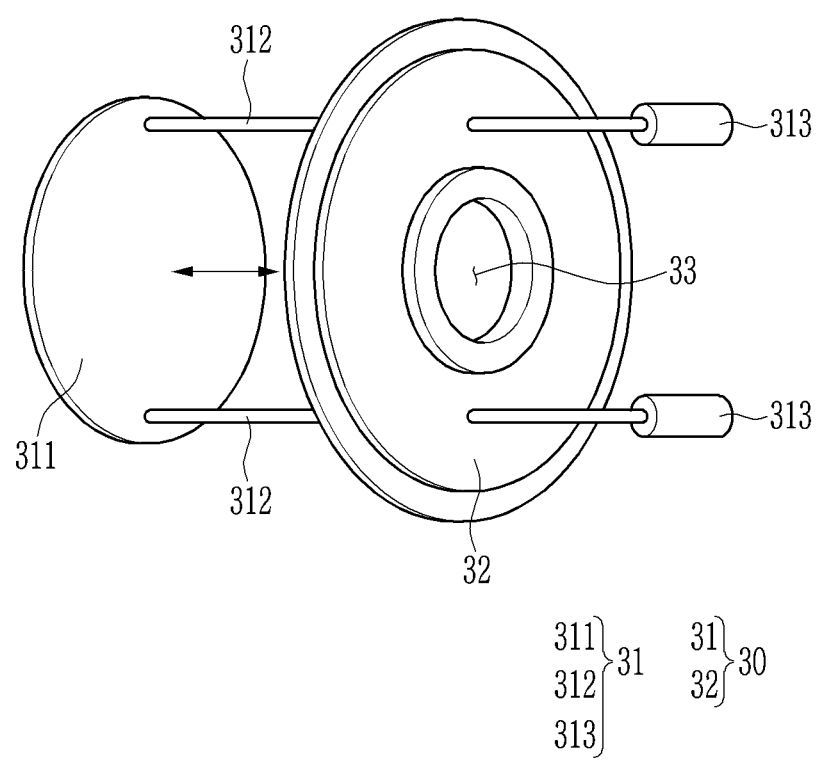
FIG. 5 illustrates a perspective view of a gate assembly of the plasma cleaning apparatus shown in FIG. 3.

FIG. 2 and FIG. 3 illustrate cross-sectional views of a plasma cleaning apparatus according to a first embodiment, FIG. 4 illustrates a right side view of the plasma cleaning apparatus shown in FIG. 2, and FIG. 5 illustrates a perspective view of a gate assembly of the plasma cleaning apparatus shown in FIG. 3.

Referring to FIG. 2 to FIG. 5, a plasma cleaning apparatus 201 of the first embodiment includes a metal chamber 20 connected to the vacuum tube 11, a gate assembly 30 including a gate 31 and a gate support 32 and coupled to the metal chamber 20, a dielectric 40 coupled to the gate support 32 outside the gate 31, and a high voltage electrode 50 positioned on an outer surface of the dielectric 40.

The vacuum tube 11 may have a cylindrical shape, and the metal chamber 20 may have a cylindrical shape or a polygonal cylindrical shape (for example, a quadrangular cylindrical shape). FIG. 4 illustrates a case in which the metal chamber 20 has a quadrangular cylinder shape as an example, but the shape of the metal chamber 20 is not limited to the illustrated example. The metal chamber 20 has an inner space communicating with the inside of the vacuum tube 11, and provides a continuous flow path of process gas.

At least one first opening 21 is formed in the metal chamber 20, and the gate assembly 30 is coupled to the metal chamber 20 to close the first opening 21. The first opening 21 may be circularly formed on one surface of the metal chamber 20. The gate assembly 30 includes the gate 31 of which a first position and a second position are switchable, and the gate support 32 supporting the gate 31 at a fixed position.

The gate support 32 may have a disk shape having a larger diameter than a diameter of the first opening 21, and may be fixed to an outer surface of the metal chamber 20 along an edge of the first opening 21. A second opening 33 having a smaller diameter than the diameter of the first opening 21 is formed at a center of the gate support 32.

The gate 31 may include a gate plate 311 positioned inside the gate support 32, a plurality of transfer rods 312 fixed to an outer surface of the gate plate 311 and passing through the gate support 32, and an actuator 313 coupled to one of the plurality of transfer rods 312. The gate plate 311 has a disc shape capable of blocking the second opening 33, and a diameter of the gate plate 311 is larger than that of the second opening 33 and smaller than that of the first opening 21.

The plurality of transfer rods 312 are orthogonal to the gate plate 311, and penetrate the gate support 32 while maintaining a sealed state. FIG. 5 illustrates the case in which the gate 31 includes two transfer rods 312, but the number and location of the transfer rods 312 are not limited to the illustrated example.

The actuator 313 changes a position of the gate plate 311 by pushing or pulling the transfer rod 312. The first and second positions of the gate plate 311 may be switchable with each other. The first position (see FIG. 2) is a position where the gate plate 311 is in close contact with the gate support 32 to block the second opening 33. The second position (see FIG. 3) is a position where the gate plate 311 opens the second opening 33 away from the gate support 32.

The dielectric 40 is a tubular member with one side opened and the other side blocked, and is coupled to an outer surface of the gate support 32 so that an inner space thereof communicates with the second opening 33. The dielectric 40 may include a tubular first dielectric 41 coupled to the gate support 32 and a plate-shaped second dielectric 42 that blocks an end portion of the first dielectric 41. The first dielectric 41 may have a cylindrical shape, and an inner diameter of the first dielectric 41 may be equal to that of the second opening 33.

The high voltage electrode 50 may be a tubular member surrounding the first dielectric 41, and is connected to a power supply 51 to receive an alternating current (AC) voltage or a high frequency (RF) voltage. The metal chamber 20 and the gate assembly 30 are grounded, and the high voltage electrode 50 is positioned at a distance from the gate support 32.

In the deposition step of the process chamber, the gate plate 311 maintains the first position, and the inner space of the dielectric 40 is blocked by the gate plate 311 and does not communicate with the inner space of the metal chamber 10. Therefore, in the deposition step of the process chamber, the process gas is not introduced into the dielectric 40, and the metal components of the undecomposed precursors and process by-products may be prevented from being applied to the inner wall of the dielectric 40.

Figure 6:
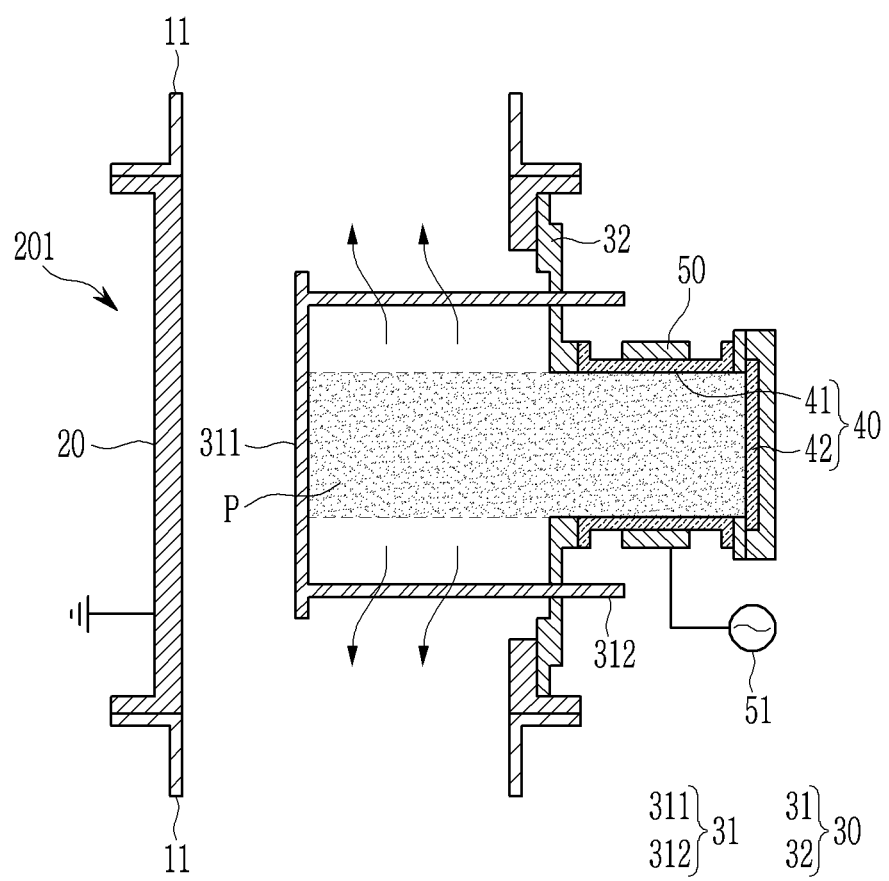

FIG. 6 is a cross-sectional view of the plasma cleaning apparatus according to the first embodiment of the present invention, schematically showing a plasma region thereof.

Referring to FIG. 6, in the cleaning step of the process chamber, the gate plate 311 moves to the second position, and the inner space of the dielectric 40 is connected to the inner space of the metal chamber 20. When a driving voltage is applied to the high voltage electrode 50, plasma P is generated in a space between the gate plate 311 and the dielectric 40 and in the inner space of the dielectric 40 due to a voltage difference between the high voltage electrode 50 and the gate plate 311.

The plasma P decomposes the discharged cleaning gas without being consumed for cleaning the process chamber to generate fluorine radicals or chlorine radicals with excellent cleaning ability, and the plasma cleaning apparatus 201 uses these radicals to clean the undecomposed precursors and process by-products accumulated in the vacuum tube, the trap device, and the vacuum pump.

Meanwhile, FIG. 2 to FIG. 6 illustrate the gate assembly 30, the dielectric 40, and the high voltage electrode 50 installed on one surface of the metal chamber 20, but the gate assembly 30, the dielectric 40, and the high voltage electrode 50 may be installed on two or more surfaces of the metal chamber 20. For example, the gate assembly 30, the dielectric 40, and the high voltage electrode 50 may be installed in pairs on two opposite surfaces of the metal chamber 20.

As described above, the gate plate 311 functions as a gate that closes the second opening 33 when plasma cleaning is not in progress and opens the second opening 33 when plasma cleaning is required, and functions as a ground electrode. In addition, since the inner space of the dielectric 40 is opened only when the plasma is discharged, it is possible to prevent the metal components of the undecomposed precursors and process by-products from being applied to the inner wall.

Accordingly, the plasma cleaning apparatus 201 of the first embodiment may prevent arcing and thus breakage of the dielectric 40, and implement stable plasma discharge to improve cleaning performance.

Figure 7:
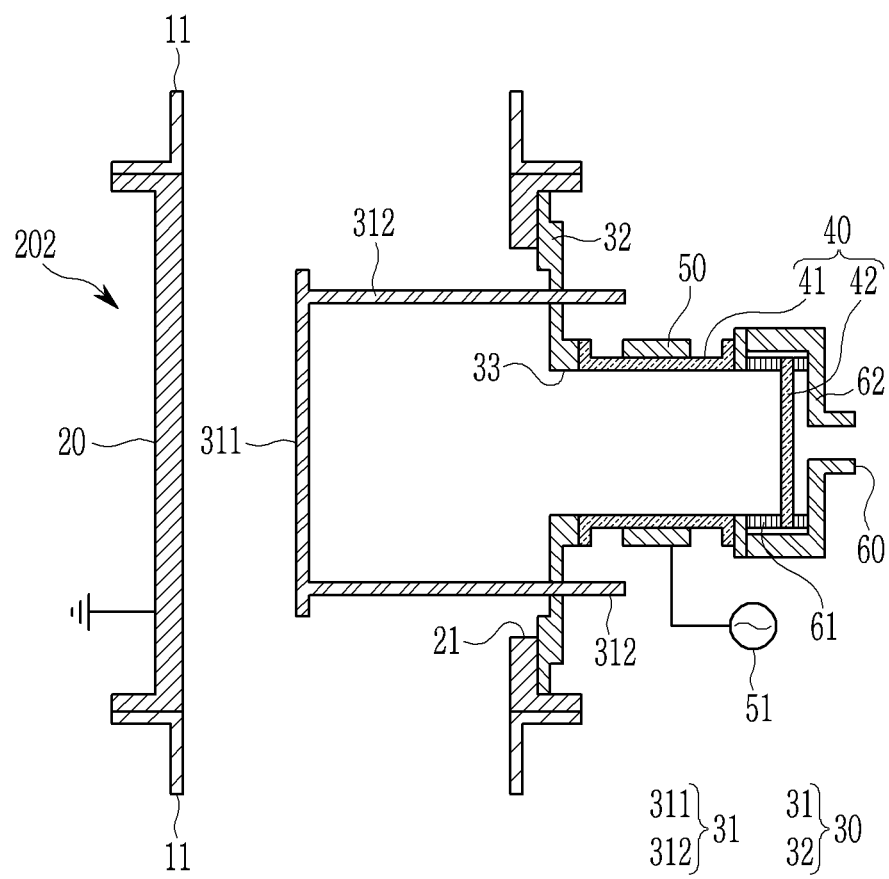
FIG. 7 illustrates a cross-sectional view of a plasma cleaning apparatus according to a second embodiment of the present invention.

FIG. 7 illustrates a cross-sectional view of a plasma cleaning apparatus according to a second embodiment of the present invention.

Referring to FIG. 7, a plasma cleaning apparatus 202 of the second embodiment includes a cleaning gas injection pipe 60 coupled to the dielectric 40. The cleaning gas injection pipe 60 may be directly coupled to the dielectric 40 or indirectly coupled to the dielectric through a mesh plate 61 and a dielectric cover 62. FIG. 7 illustrates the second case as an example.

The mesh plate 61 is positioned at an edge of a second dielectric 42 at a distance from the first dielectric 41, and the dielectric cover 62 is configured to surround the mesh plate 61 and the second dielectric 42 at a predetermined distance therefrom. The dielectric cover 62 may be fixed to an end portion of the first dielectric 41, and the cleaning gas injection pipe 60 may be coupled to a center of the dielectric cover 62. The cleaning gas is injected into the inner space of the dielectric 40 through the inside of the dielectric cover 62 and an opening of the mesh plate 61.

Since the plasma cleaning apparatus 202 of the second embodiment is supplied with the cleaning gas through the cleaning gas injection pipe 60, when the plasma cleaning is required, the plasma cleaning may be performed by receiving the cleaning gas without being associated with the operation of the process chamber. The plasma cleaning apparatus 202 of the second embodiment has a configuration that is similar to the first embodiment described above, except that the cleaning gas injection pipe 60 is added.

Figure 8:
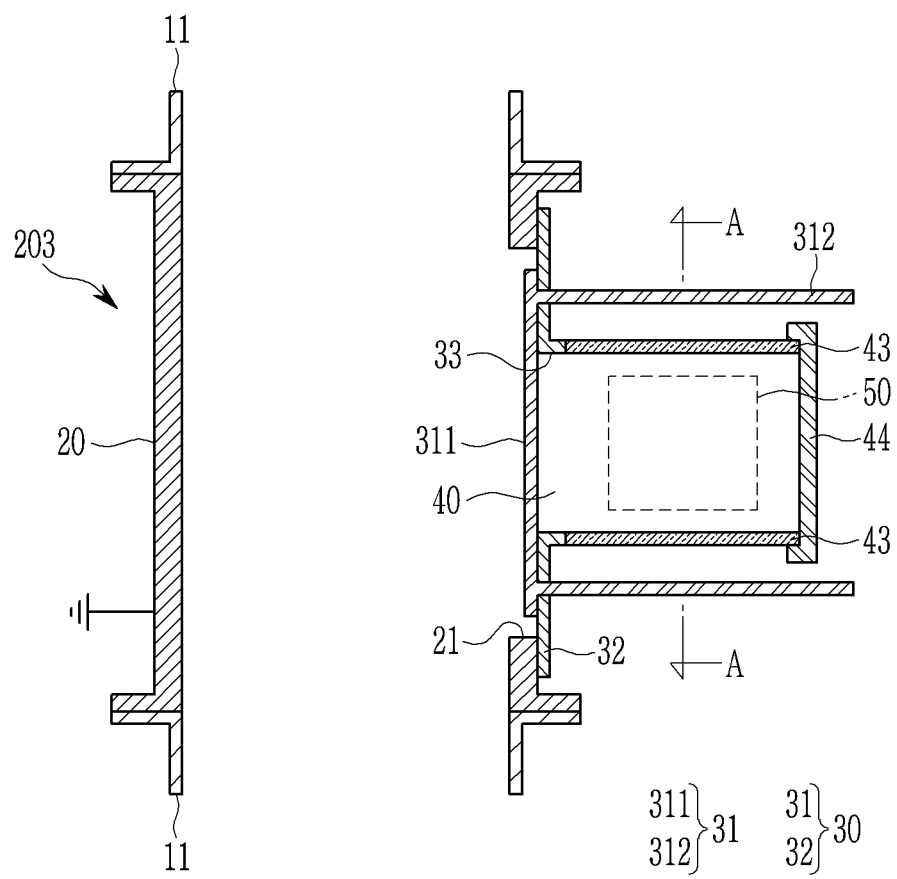
FIG. 8 illustrates a cross-sectional view of a plasma cleaning apparatus according to a third embodiment of the present invention.
Figure 9:
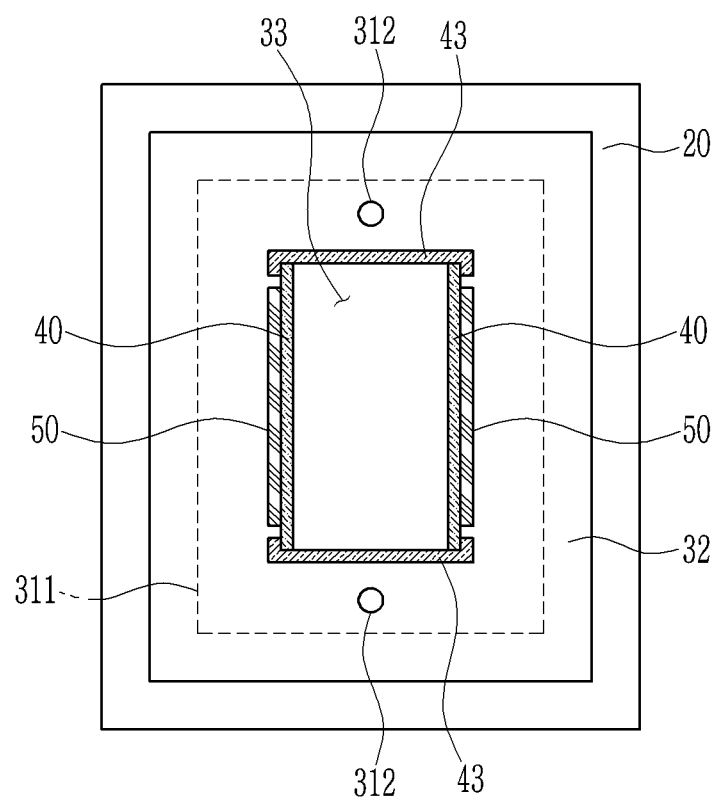
FIG. 9 illustrates a cross-sectional view taken along line A-A of FIG. 8.

FIG. 8 illustrates a cross-sectional view of a plasma cleaning apparatus according to a third embodiment of the present invention, and FIG. 9 illustrates a cross-sectional view taken along line A-A of FIG. 8.

Referring to FIG. 8 and FIG. 9, in a plasma cleaning apparatus 203 of the third embodiment, the first opening 21 of the metal chamber 20, the gate support 32, the second opening 33 of the gate support 32, and the gate plate 311 are quadrangular, and the dielectric 40 includes a pair of quadrangular plates facing each other.

A pair of dielectrics 40 may form a quadrangular tube with a pair of metal supports 43, and a metal cover 44 may be coupled to end portions of the pair of dielectrics 40 and the pair of metal supports 43 to seal their inner spaces. The high voltage electrode 50 is made of a quadrangular plate having a smaller size than that of the dielectric 40, and is positioned on an outer surface of the dielectric 40 at a distance from the gate support 32 and the metal support 43.

The plasma cleaning apparatus 203 of the third embodiment has the same or similar configuration as the first embodiment, except that the above-mentioned elements are quadrangular, and it operates in the same manner as the first embodiment.

Figure 10:
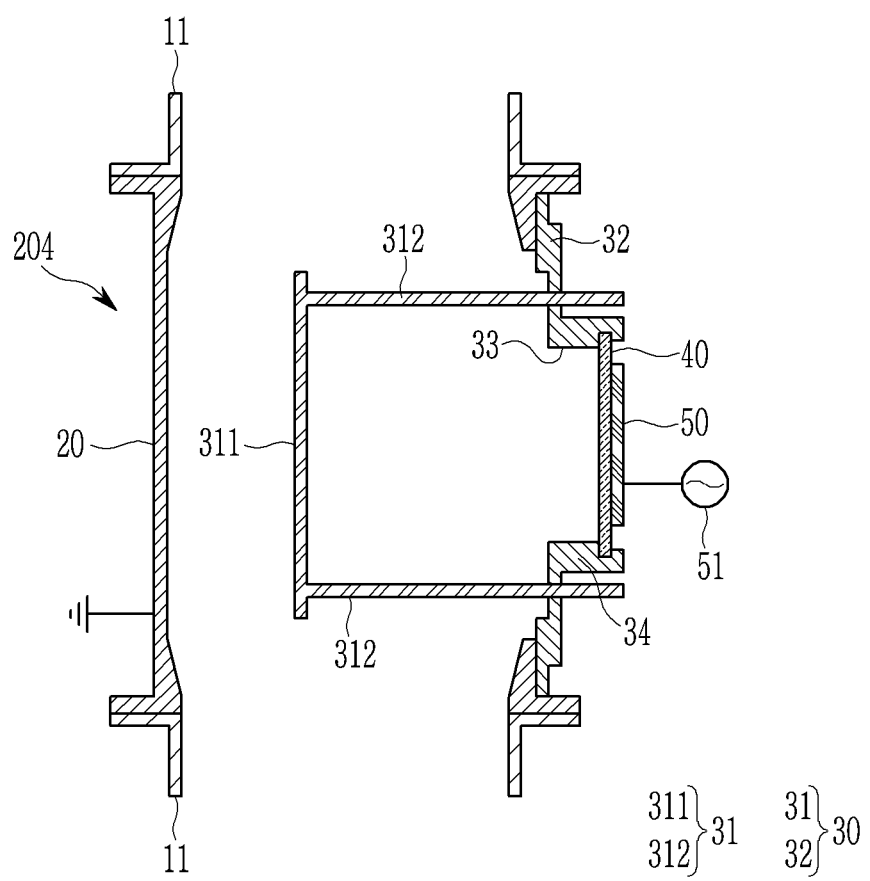
FIG. 10 illustrates a cross-sectional view of a plasma cleaning apparatus according to a fourth embodiment of the present invention.
Figure 11:
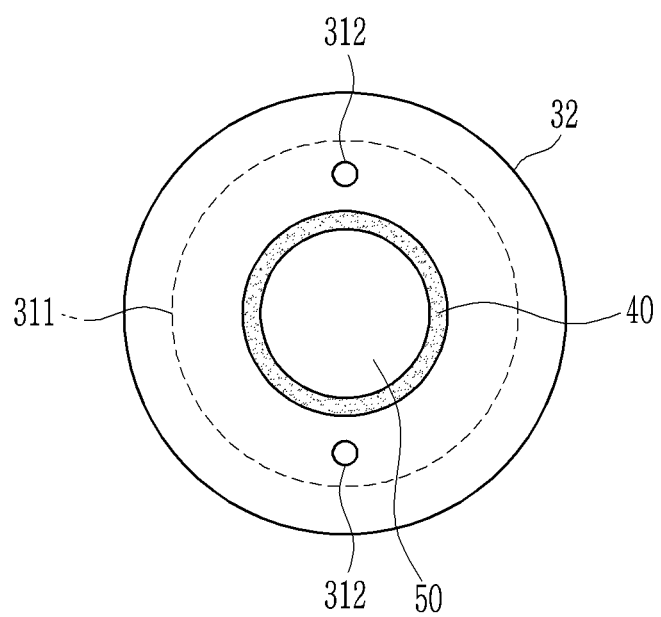
FIG. 11 illustrates a right side view of the plasma cleaning apparatus shown in FIG. 10.
Figure 12:
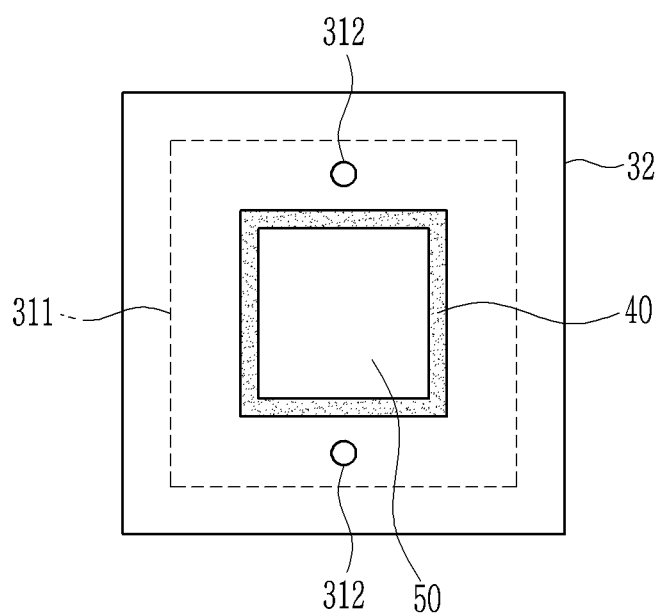
FIG. 12 illustrates a modification of the plasma cleaning apparatus shown in FIG. 11.

FIG. 10 illustrates a cross-sectional view of a plasma cleaning apparatus according to a fourth embodiment of the present invention, FIG. 11 illustrates a right side view of the plasma cleaning apparatus shown in FIG. 10, and FIG. 12 illustrates a modification of the plasma cleaning apparatus shown in FIG. 11.

Referring to FIG. 10 to FIG. 12, in a plasma cleaning apparatus 204 of the fourth embodiment, the dielectric 40 is formed of a plate-shaped member of a disc or quadrangular plate shape, and the high voltage electrode 50 is also formed of a plate-shaped member of a disc or quadrangular plate shape. In this case, the high voltage electrode 50 is formed to have a smaller size than that of the dielectric 40 and is positioned at a distance from the gate support 32. The gate plate 311 may be formed of a disc or quadrangular plate, such as that of the dielectric 40.

The gate support 32 may include a first flange 34 surrounding the second opening 33 and extending outwardly, and the dielectric 40 may be coupled to an end portion of the first flange 34. In this case, since the gate plate 311 is positioned at a distance from the dielectric 40 when the gate plate 311 is in the first position, damage to the dielectric 40 due to contact between the gate plate 311 and the dielectric 40 may be suppressed.

The plasma cleaning apparatus 204 of the fourth embodiment has the same or similar configuration as the first embodiment, except for the above-mentioned elements, and it operates in the same manner as the first embodiment.

Figure 13:
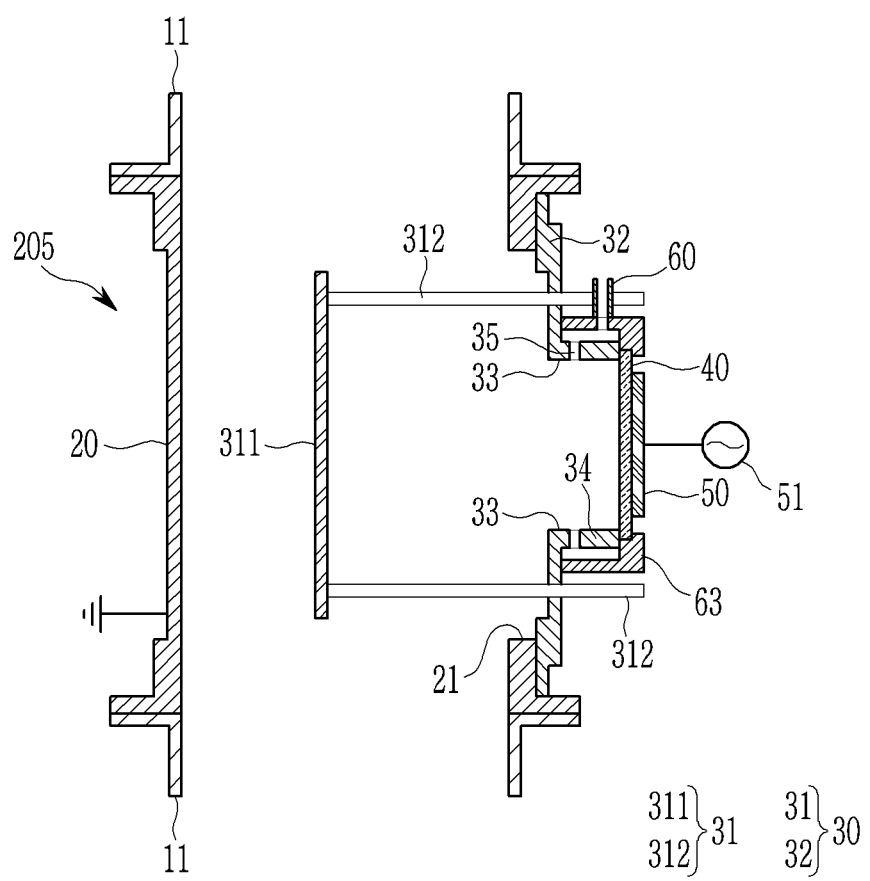
FIG. 13 illustrates a cross-sectional view of a plasma cleaning apparatus according to a fifth embodiment of the present invention.
Figure 14:
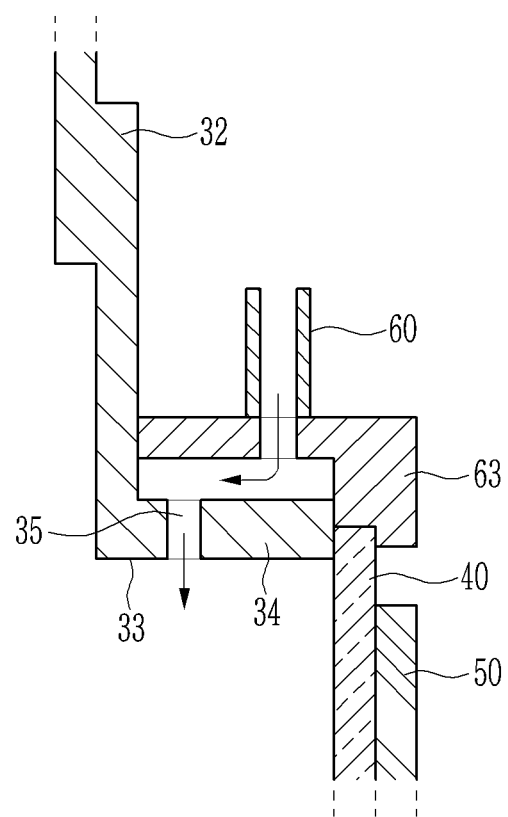
FIG. 14 illustrates a partially enlarged view of FIG. 13.

FIG. 13 illustrates a cross-sectional view of a plasma cleaning apparatus according to a fifth embodiment of the present invention, and FIG. 14 illustrates a partially enlarged view of FIG. 13.

Referring to FIG. 13 and FIG. 14, a plasma cleaning apparatus 205 of the fifth embodiment includes the cleaning gas injection pipe 60 coupled to the dielectric 40. The cleaning gas injection pipe 60 may be directly coupled to the dielectric 40, or indirectly coupled to the dielectric 40 through the dielectric cover 63. FIG. 13 illustrates the second case as an example.

A dielectric cover 63 surrounds the first flange 34 at a distance from the first flange 34 of the gate support 32, and is in close contact with an end portion of the dielectric 40. The cleaning gas injection pipe 60 is coupled to the dielectric cover 63, and at least one third opening 35 for passing the cleaning gas is positioned in the first flange 34. The cleaning gas is injected into the dielectric 40 through the inside of the dielectric cover 63 and the third opening 35 of the first flange 34.

The plasma cleaning apparatus 205 of the fifth embodiment has a configuration that is similar to the fourth embodiment described above, except that the cleaning gas injection pipe 60 is added.

Figure 15:
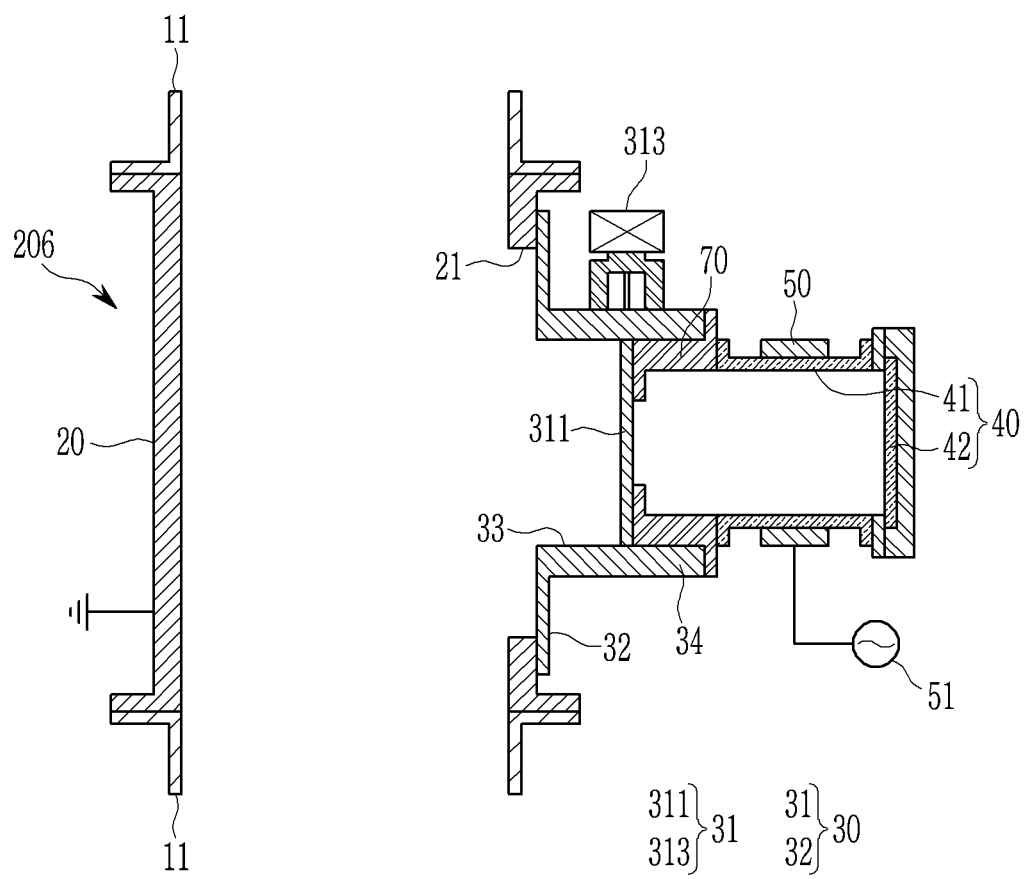
FIG. 15 and FIG. 16 illustrate cross-sectional views of a plasma cleaning apparatus according to a sixth embodiment of the present invention.
Figure 16:
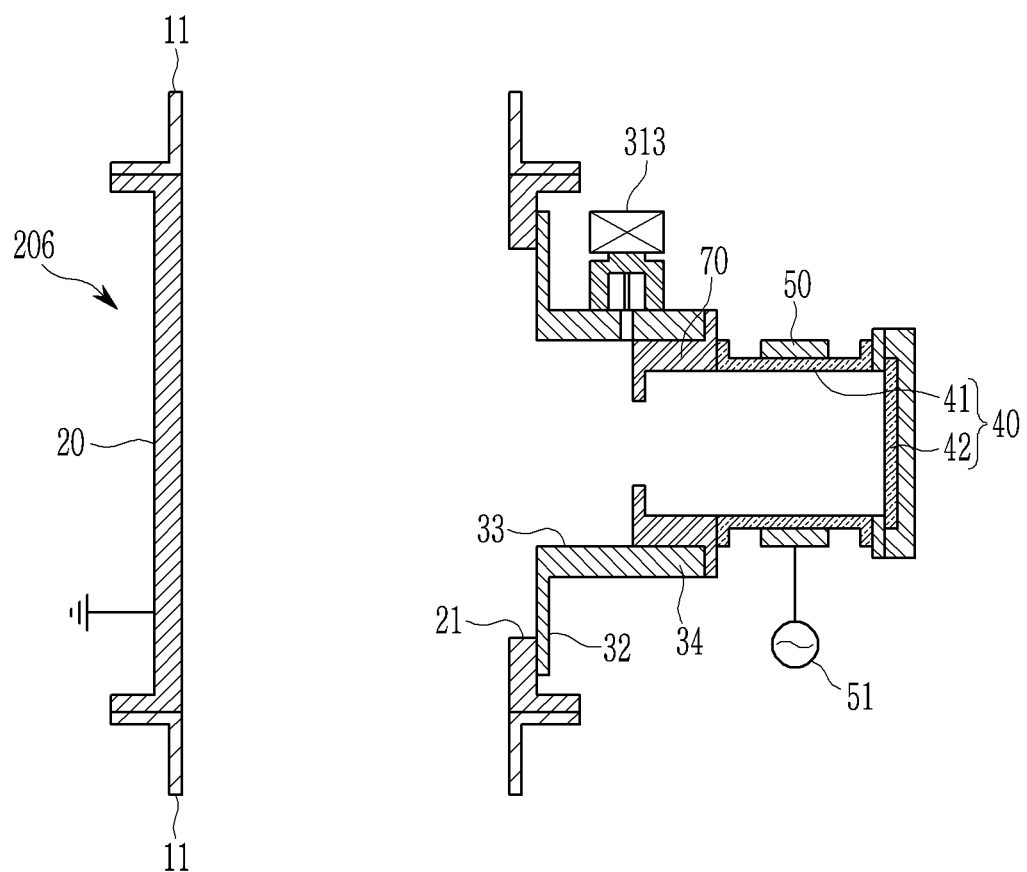
Figure 17:
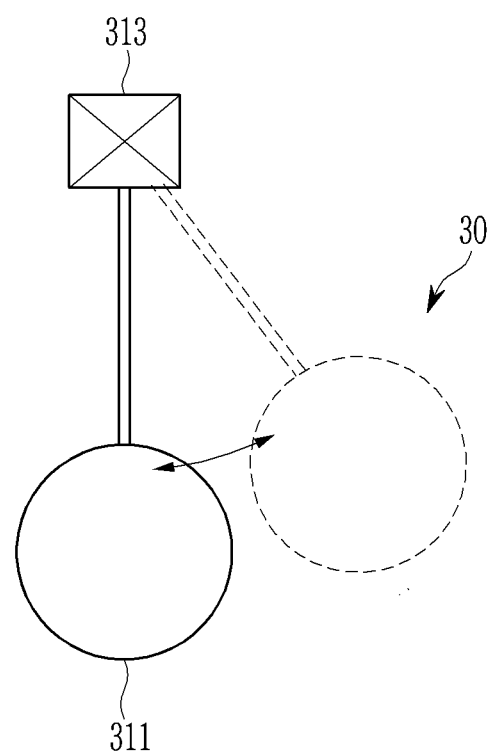
FIG. 17 and FIG. 18 illustrate schematic views for explaining an operating state of a gate plate of the plasma cleaning apparatus shown in FIG. 15.
Figure 18:
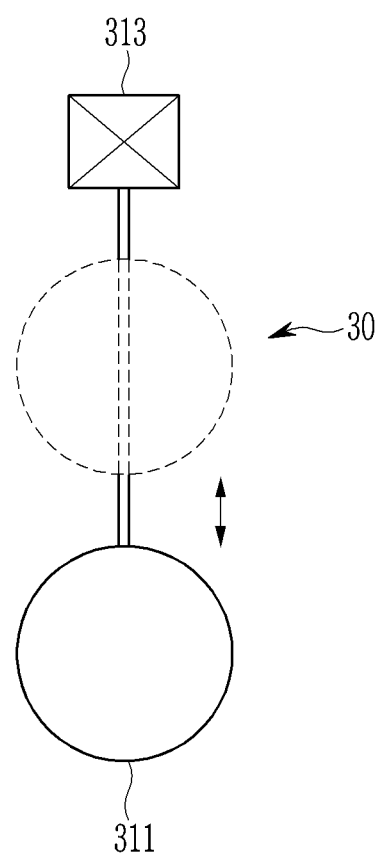

FIG. 15 and FIG. 16 illustrate cross-sectional views of a plasma cleaning apparatus according to a sixth embodiment of the present invention, and FIG. 17 and FIG. 18 illustrate schematic views for explaining an operating state of a gate plate of the plasma cleaning apparatus shown in FIG. 15.

Referring to FIG. 15 to FIG. 18, a plasma cleaning apparatus 206 of the sixth embodiment includes a ground electrode 70 coupled between the gate support 32 and the dielectric 40, and the gate 30 does not function as a ground electrode at the second position at which the second opening 33 is opened.

The gate support 32 includes the first flange 34 surrounding the second opening 33 and extending outwardly, and the ground electrode 70 having a tubular shape is positioned inside an end portion of the first flange 34. A length of the ground electrode 70 may be smaller than that of the first flange 34. The tubular first dielectric 41 is coupled to an end portion of the ground electrode 70 so that inner spaces of the ground electrode 70 and the dielectric 40 are connected to each other.

The gate 30 may include the gate plate 311 formed in a plate shape corresponding to the second opening 33 and the actuator 313 coupled to the gate plate 311. The gate plate 311 and the actuator 313 may be coupled to the first flange 34. The actuator 313 may be a rotary motor or a linear transfer motor.

When the actuator 313 is a rotary motor, the gate plate 311 rotates around the actuator 313 (see FIG. 17). When the actuator 313 is a linear transfer motor, the gate plate 311 moves linearly (see FIG. 18). In both cases, in the first position, the gate plate 311 is positioned inside the first flange 34 to block the second opening 33, and in the second position, the gate plate 311 moves away from the first flange 34 to open the second opening 33.

In the first position, the gate plate 311 may be positioned directly inside the ground electrode 70, and the gate assembly 30 always maintains a sealed state regardless of the location of the gate plate 311 to prevent vacuum leakage. In the deposition step of the process chamber, the gate plate 311 maintains the first position to close the second opening 33, and prevents metal components of precursors and process by-products from being applied to the inner wall of the dielectric 40.

In the cleaning step of the process chamber, the gate plate 311 moves to the second position, and the inner spaces of the ground electrode 70 and the dielectric 40 are connected to the inner space of the metal chamber 20. Subsequently, a driving voltage is applied to the high voltage electrode 50 to generate plasma in the inner spaces of the dielectric 40, the ground electrode 70, and the first flange 34, and the plasma diffuses into the inner space of the metal chamber 20, so that plasma cleaning is performed.

The plasma cleaning apparatus 206 of the sixth embodiment has a configuration that is similar to the first embodiment described above, except for the configuration of the gate 31.

Figure 19:
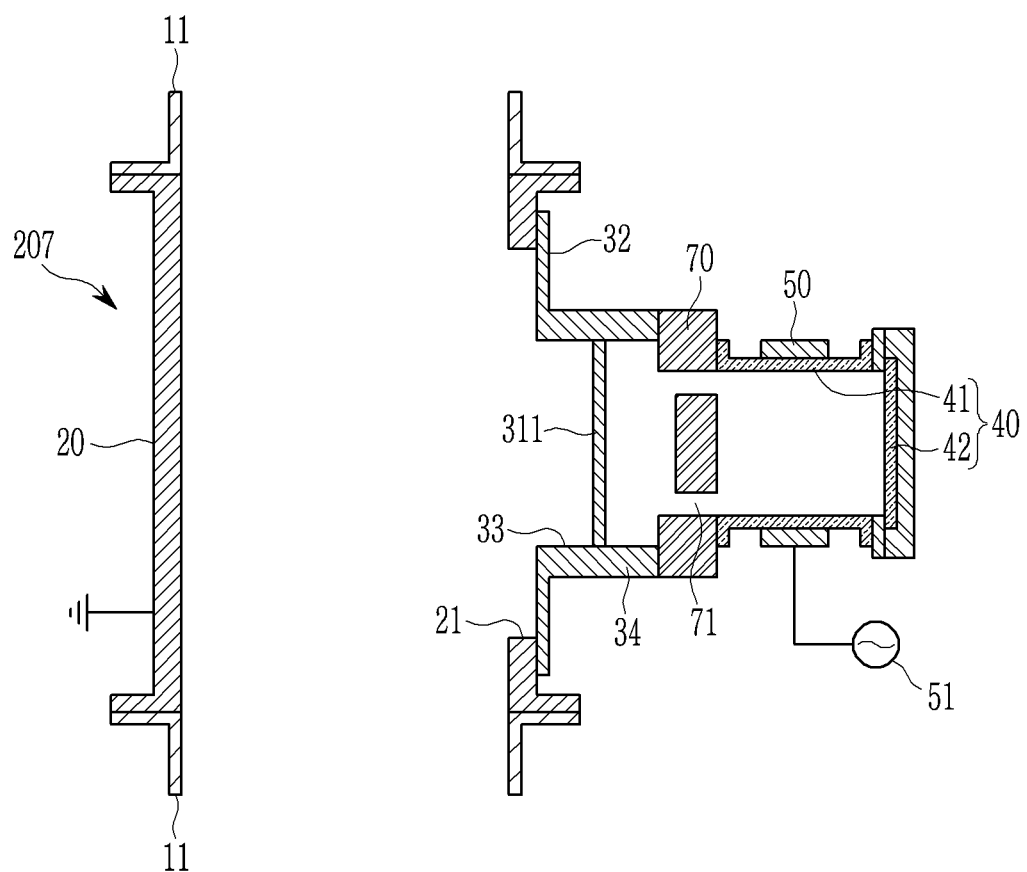
FIG. 19 and FIG. 20 illustrate cross-sectional views of a plasma cleaning apparatus according to a seventh embodiment of the present invention.
Figure 20:
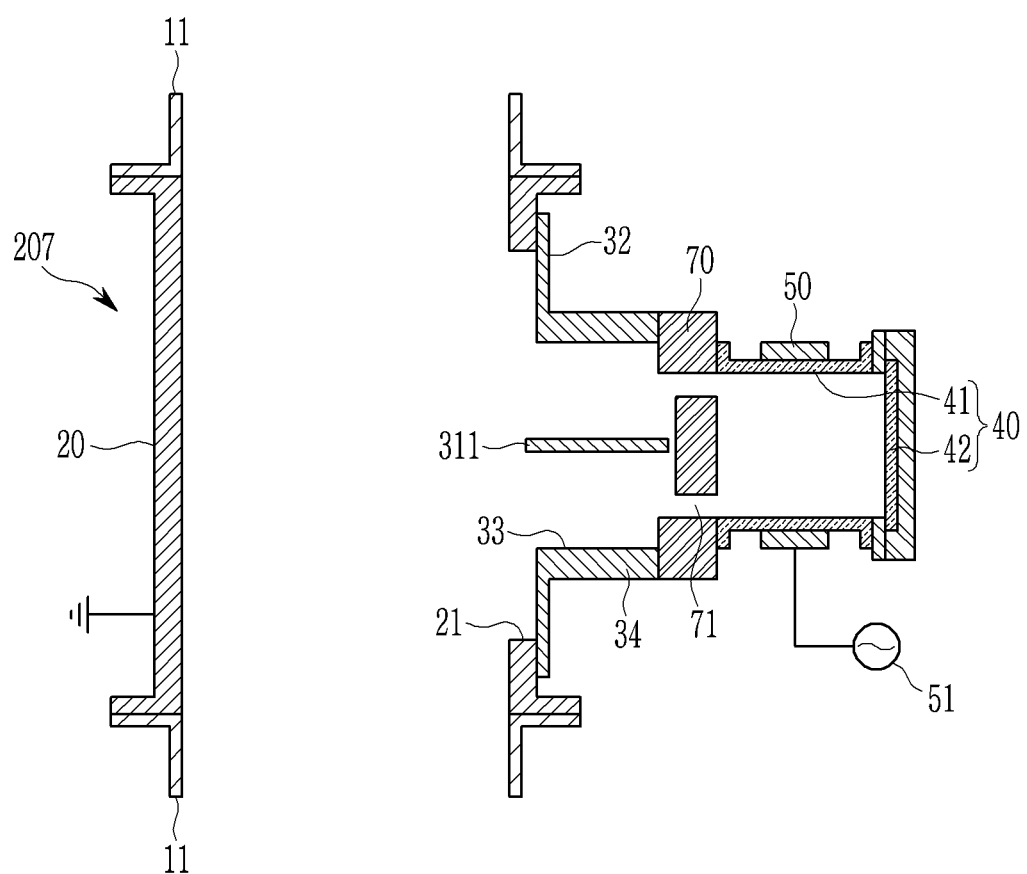
Figure 21:
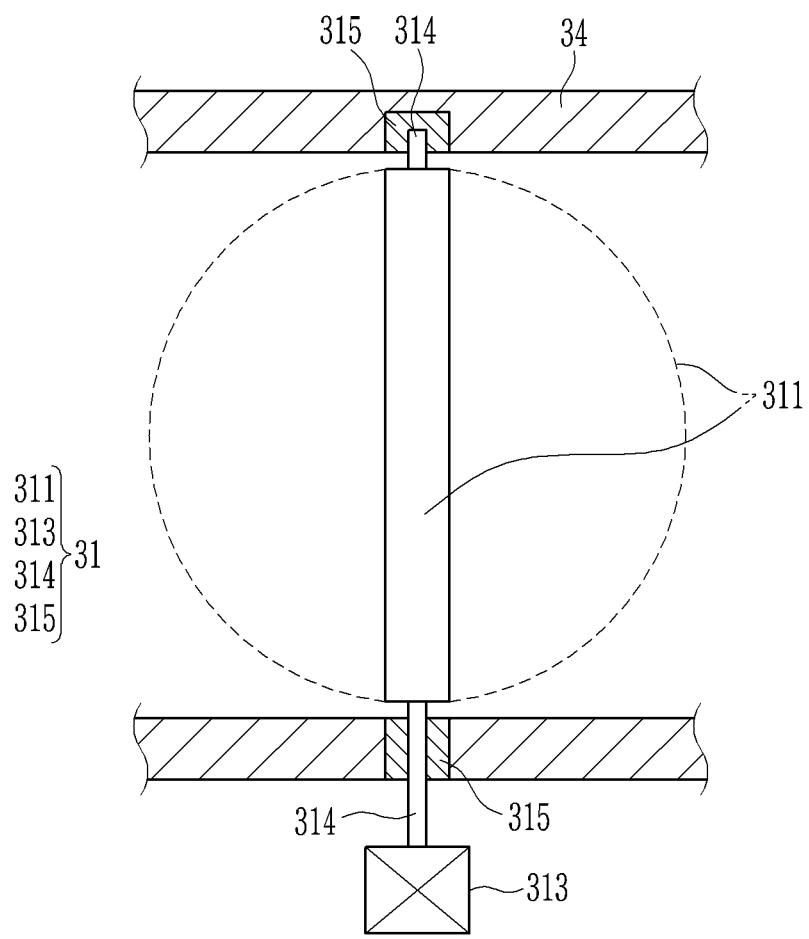
FIG. 21 illustrates a partial top plan view of the plasma cleaning apparatus shown in FIG. 19.

FIG. 19 and FIG. 20 illustrate cross-sectional views of a plasma cleaning apparatus according to a seventh embodiment of the present invention, and FIG. 21 illustrates a partial top plan view of the plasma cleaning apparatus shown in FIG. 19.

Referring to FIG. 19 to FIG. 21, in a plasma cleaning apparatus 207 of the seventh embodiment, the ground electrode 70 is made of a porous plate having at least one fourth opening 71, and is coupled to an edge of the first flange 34.

The gate 31 may include the gate plate 311 positioned inside the first flange 34, a pair of rotating shafts 314 supported by the first flange 34 and coupled to two points of the gate plate 311 facing each other, and the actuator 313 coupled to one of the rotating shafts 314. The gate plate 311 may have a disc shape corresponding to the second opening 33, and the pair of rotating shafts 314 may be coupled to the first flange 34 by bearings 315.

One of the pair of rotating shafts 314 may penetrate the first flange 34, and the actuator 313 may be coupled to the rotating shaft 314 outside the first flange 34. The actuator 313 may be a rotary motor, and may rotate the gate plate 311 through the rotating shaft 314.

The gate plate 311 may be orthogonal to the first flange 34 at the first position to block the second opening 33, and may be rotated 90° by an operation of the actuator 313 to be switched to the second position. The gate plate 311 is parallel to the first flange 34 at the second position to open the second opening 33. The gate plate 311 is positioned at a sufficient distance from the ground electrode 70 so as to not contact the ground electrode 70 at the second position.

The plasma cleaning apparatus 207 of the seventh embodiment has a configuration that is similar to the sixth embodiment described above, except for the shape of the ground electrode 70 and the configuration of the gate 31.

Figure 22:
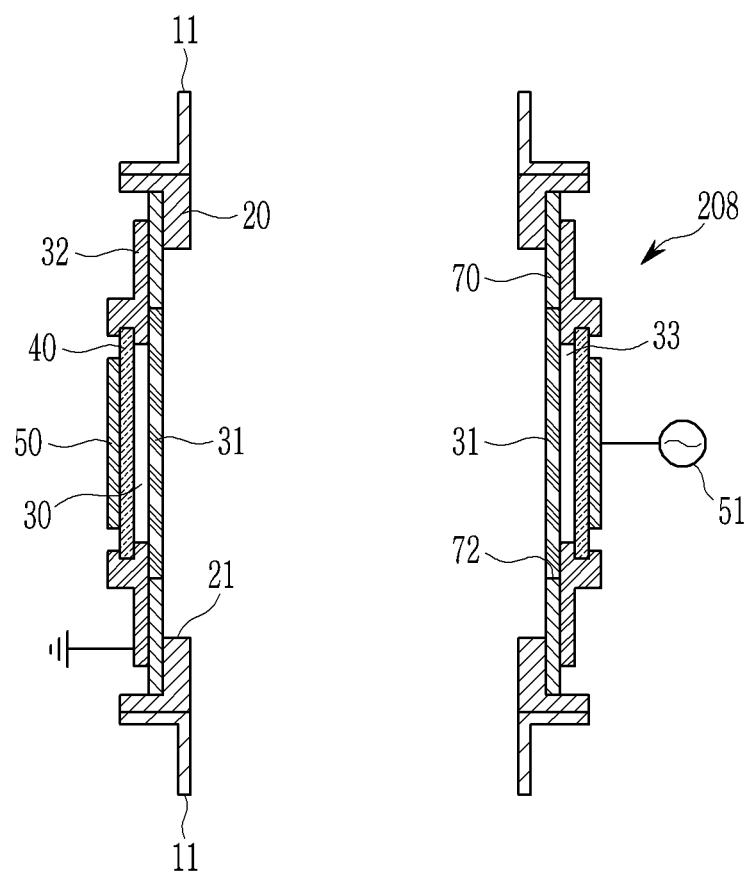
FIG. 22 and FIG. 23 illustrate cross-sectional views of a plasma cleaning apparatus according to an eighth embodiment of the present invention.
Figure 23:
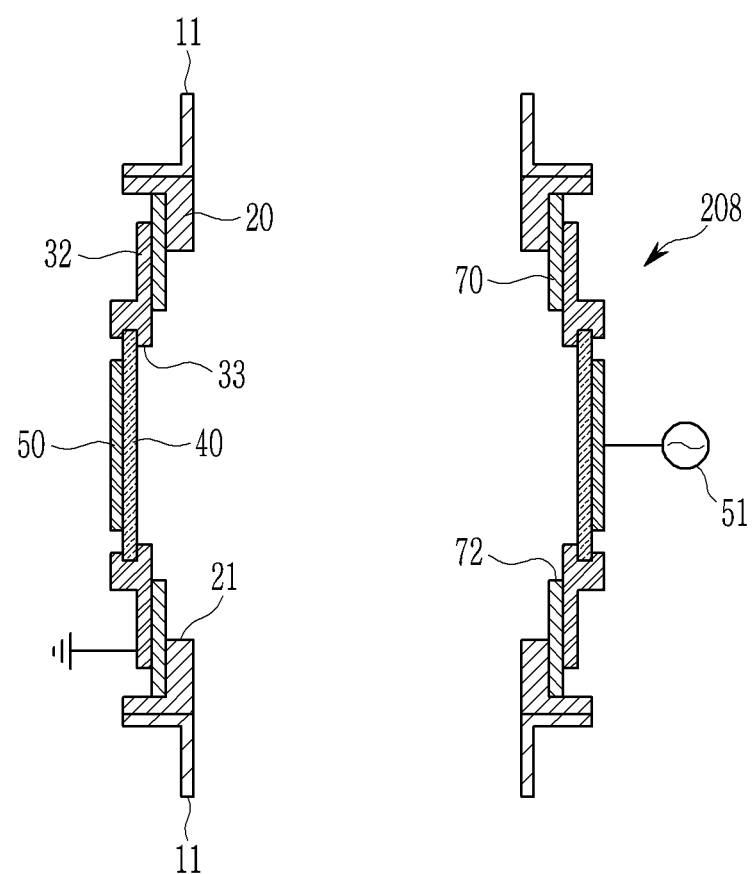

FIG. 22 and FIG. 23 illustrate cross-sectional views of a plasma cleaning apparatus according to an eighth embodiment of the present invention.

Referring to FIG. 22 and FIG. 23, in a plasma cleaning apparatus 208 of the eighth embodiment, the gate 31, the gate support 32, the dielectric 40, the high voltage electrode 50, and the ground electrode 70 are all formed in a plate shape.

Specifically, the gate support 32 is a plate-shaped member having the second opening 33, and the plate-shaped dielectric 40 is coupled to the outer surface of the gate support 32 so as to block the second opening 33. The ground electrode 70 is fixed to the inside of the gate support 32, and a fifth opening 72 is positioned at the center of the ground electrode 70. A width (or diameter) of the fifth opening 72 is greater than a width (or diameter) of the second opening 33.

The gate 31 is positioned inside the gate support 32, and is formed of a plate-shaped member corresponding to the fifth opening 72. The gate 31 blocks the fifth opening 72 of the ground electrode 70 at the first position (see FIG. 22), and opens the fifth opening 72 of the ground electrode 70 at the second position (see FIG. 23). The gate 31 may block the fifth opening 72 or be spaced apart from the fifth opening 72 to open the fifth opening 72, by rotational movement or linear movement by an actuator (not shown).

In the deposition step of the process chamber, the gate 31 is positioned at the first position so that the dielectric 40 does not face the inner space of the metal chamber 20, and in the cleaning step of the process chamber, the gate 31 is switched to the second position so that the dielectric 40 faces the inner space of the metal chamber 20. Subsequently, a driving voltage is applied to the high voltage electrode 50 to generate plasma, thus plasma cleaning is performed.

Figure 24:
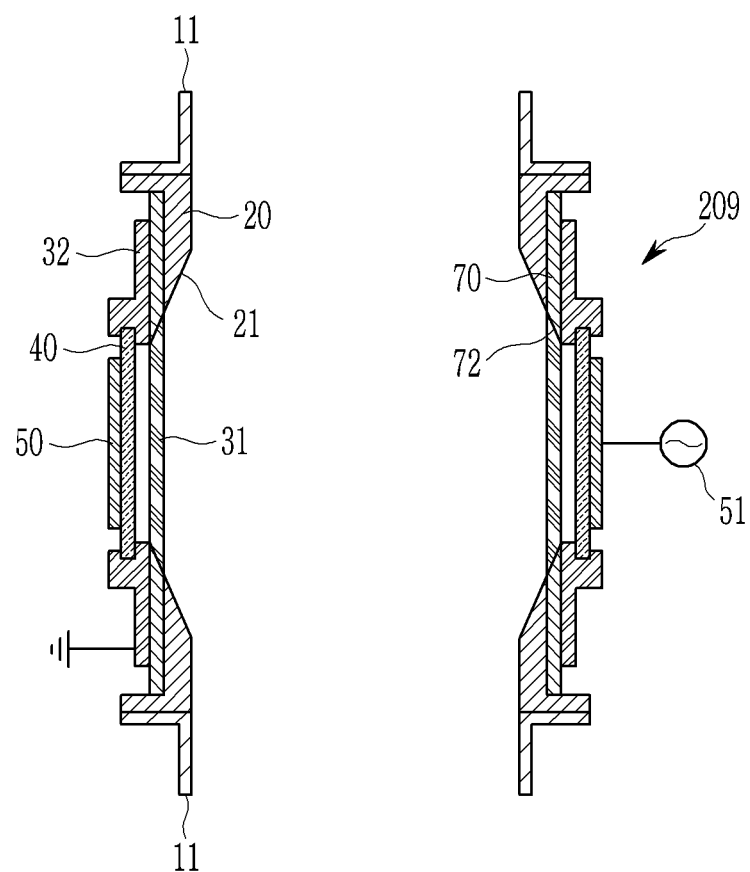
FIG. 24 and FIG. 25 illustrate cross-sectional views of a plasma cleaning apparatus according to a ninth embodiment of the present invention.
Figure 25:
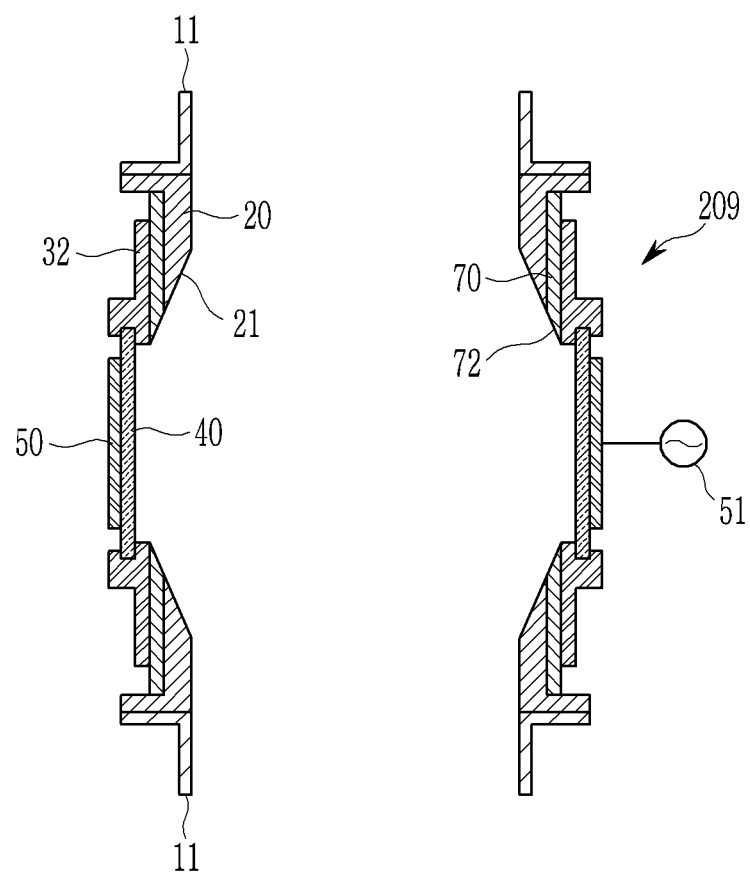

FIG. 24 and FIG. 25 illustrate cross-sectional views of a plasma cleaning apparatus according to a ninth embodiment of the present invention.

Referring to FIG. 24 and FIG. 25, in a plasma cleaning apparatus 209 of the ninth embodiment, a portion surrounding the first opening 21 of the metal chamber 20, a portion surrounding the fifth opening 72 of the ground electrode 70, and an edge of the gate 31 are formed to have an inclined surface. The inclined surface guides diffusion of plasma, and has an effect of suppressing arc generation by preventing a sharp portion of a metal from being exposed to a plasma region.

The plasma cleaning apparatus 209 of the ninth embodiment is the same as or similar to the configuration of the eighth embodiment described above, except for the inclined surface.

Figure 26:
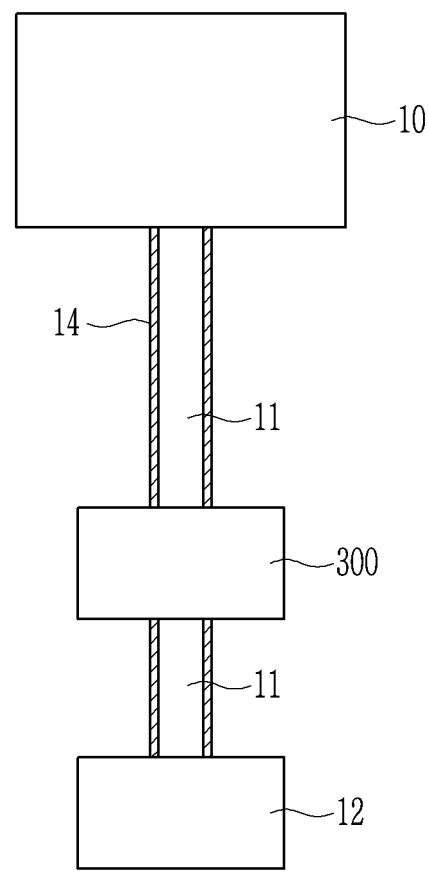
FIG. 26 illustrates a schematic view of semiconductor process equipment according to a second embodiment of the present invention.

FIG. 26 illustrates a schematic view of semiconductor process equipment according to a second embodiment of the present invention.

Referring to FIG. 26, semiconductor process equipment 102 of the second embodiment illustrates the process chamber 10 in which a deposition process is performed, the vacuum pump 12 connected to the process chamber 10 by the vacuum tube 11 and evacuating the inside of the process chamber 10, and a trap-integrated plasma cleaning apparatus 300 connected to the vacuum tube 11.

The heater 14 may be installed in the vacuum tube 11 to increase the temperature of the vacuum tube 11 to suppress a phase change of an undecomposed precursor into a liquid. The trap-integrated plasma cleaning apparatus 300 includes one of the plasma cleaning apparatuses of tenth and eleventh embodiments described below.

Figure 27:
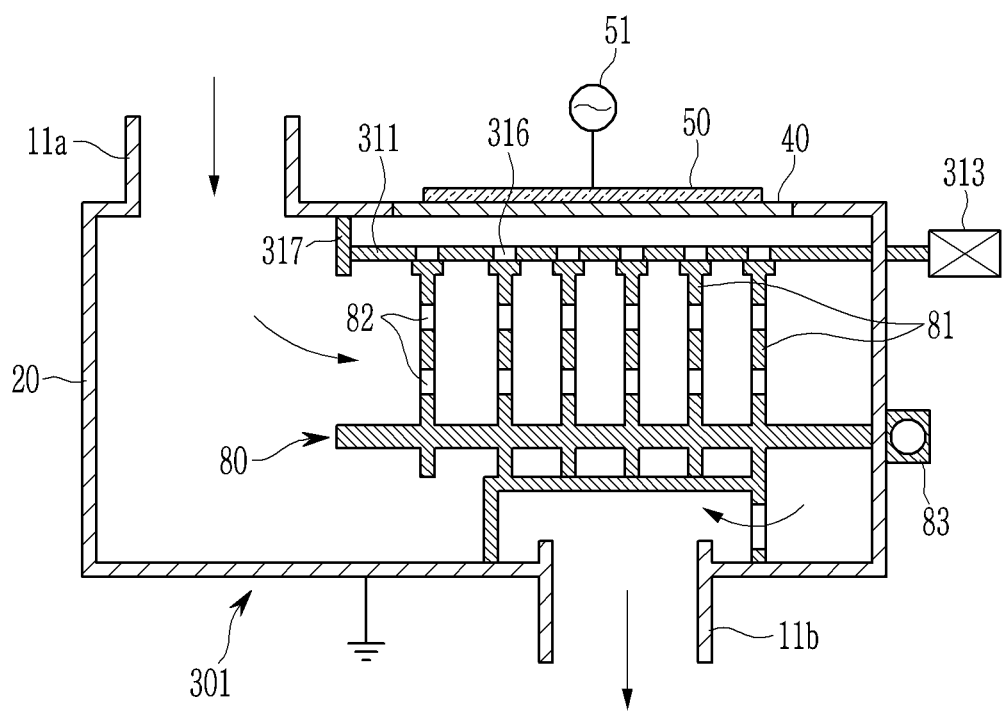
FIG. 27 and FIG. 28 illustrate cross-sectional views of a plasma cleaning apparatus according to a tenth embodiment of the present invention.
Figure 28:
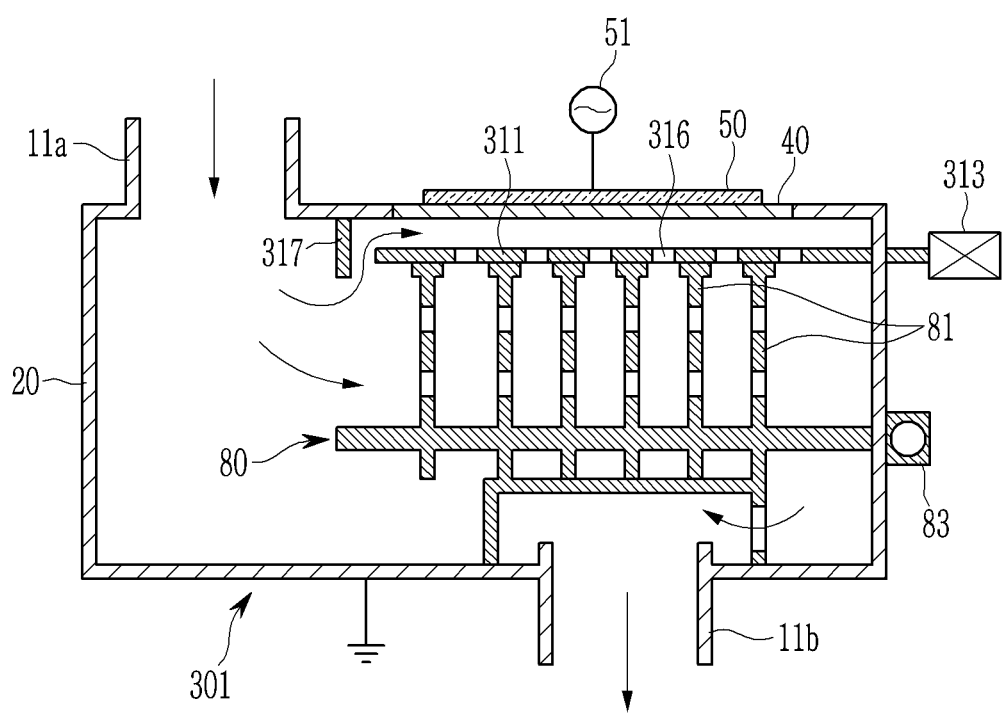

FIG. 27 and FIG. 28 illustrate cross-sectional views of a plasma cleaning apparatus according to a tenth embodiment of the present invention.

Referring to FIG. 27 and FIG. 28, a plasma cleaning apparatus 301 of the tenth embodiment includes the metal chamber 20 coupled to the vacuum tube 11, a trap 80 positioned in the inner space of the metal chamber 20 and capturing process by-products, the dielectric 40 coupled to the metal chamber 20, the high voltage electrode 50 positioned on the outer surface of the dielectric 40, and the gate 31 positioned between the trap 80 and the dielectric 40.

The metal chamber 20 may have a rectangular parallelepiped shape long in a horizontal direction, and an inlet vacuum tube 11a and an outlet vacuum tube 11b may be positioned to be deviated from each other in the horizontal direction. The process gas may flow in the horizontal direction in the metal chamber 20, and the trap 80 may be configured of a plurality of porous plates 81 continuously arranged in the horizontal direction.

The plurality of porous plates 81 are provided with a plurality of sixth openings 82 for passing process gas, and each of the plurality of porous plates 81 may be positioned parallel to a vertical direction. The undecomposed precursors and process by-products in the process gas introduced into the metal chamber 20 collide with and are trapped by the plurality of porous plates 81, and then are continuously accumulated on the plurality of porous plates 81. In the drawings, reference numeral 83 denotes a heating part coupled to the plurality of porous plates 81.

The first opening is positioned at a portion corresponding to an upper side of the plurality of porous plates 81 among the metal chambers 20, and the dielectric 40 is coupled to the metal chamber 20 to block the first opening. The dielectric 40 and the high voltage electrode 50 may be plate-shaped members, and the high voltage electrode 50 is formed to have a smaller size than that of the dielectric 40 and is positioned at a distance from the metal chamber 20 along an edge.

The gate 31 may include the gate plate 311 positioned inside the metal chamber 20 to contact an upper end portion of the plurality of porous plates 81, and the actuator 313 positioned outside the metal chamber 311 and coupled to the gate plate 311 to move the gate plate 311.

The gate plate 311 may be positioned parallel to the horizontal direction, and a plurality of seventh openings 316 corresponding to the plurality of porous plates 81 may be formed in the gate plate 311. A stopper 317 that limits the movement of the gate plate 311 may be fixed to an inner side of the metal chamber 20. The gate plate 311 is grounded together with the plurality of porous plates 81 to function as a ground electrode.

The first and second positions of the gate plate 311 may be switchable with each other. The first position (see FIG. 27) is a position where the gate plate 311 blocks between the plurality of porous plates 81 and the dielectric 40, and the second position (see FIG. 28) is a position where the gate plate 311 opens between the plurality of porous plates 81 and the dielectric 40.

At the first position, the gate plate 311 contacts the stopper 317, and the plurality of seventh openings 316 are positioned corresponding to respective upper end portions of the plurality of porous plates 311. In the deposition step of the process chamber, the gate plate 311 maintains the first position, and the process gas flowing into the metal chamber 20 is blocked by the gate plate 311 to not flow in a direction of the dielectric 40. Therefore, it is possible to prevent the metal component of the process gas from being applied to the dielectric 40.

At the second position, the gate plate 311 is separated from the stopper 317, and the plurality of seventh openings 316 are positioned correspondingly between the plurality of porous plates 81. In the cleaning step of the process chamber, the gate plate 311 maintains the second position, and a driving voltage is applied to the high voltage electrode 50. Thus, plasma is generated in both of the gate plate 311 and the trap 80, and fluorine radicals or chlorine radicals having excellent cleaning ability gasify process by-products accumulated in the trap 80.

A conventional trap device does not have a self-cleaning function, but the trap-integrated plasma cleaning apparatus 301 captures process by-products in the deposition step of the process chamber and generates plasma in the cleaning step of the process chamber to clean the process by-products trapped in the trap 80. The trap-integrated plasma cleaning apparatus 301 has a self-cleaning function to increase the service lifespan of the trap 80, thereby effectively increasing a replacement cycle.

Figure 29:
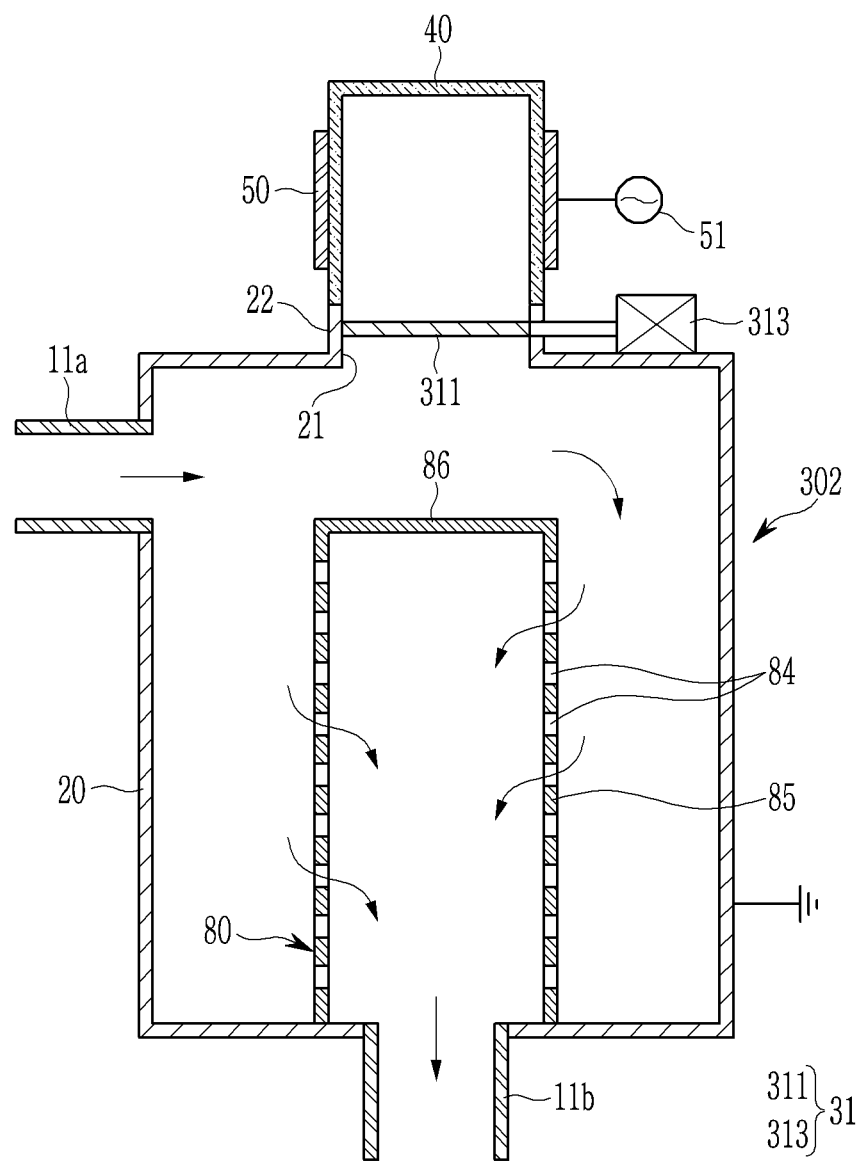
FIG. 29 and FIG. 30 illustrate cross-sectional views of a plasma cleaning apparatus according to an eleventh embodiment of the present invention.
Figure 30:
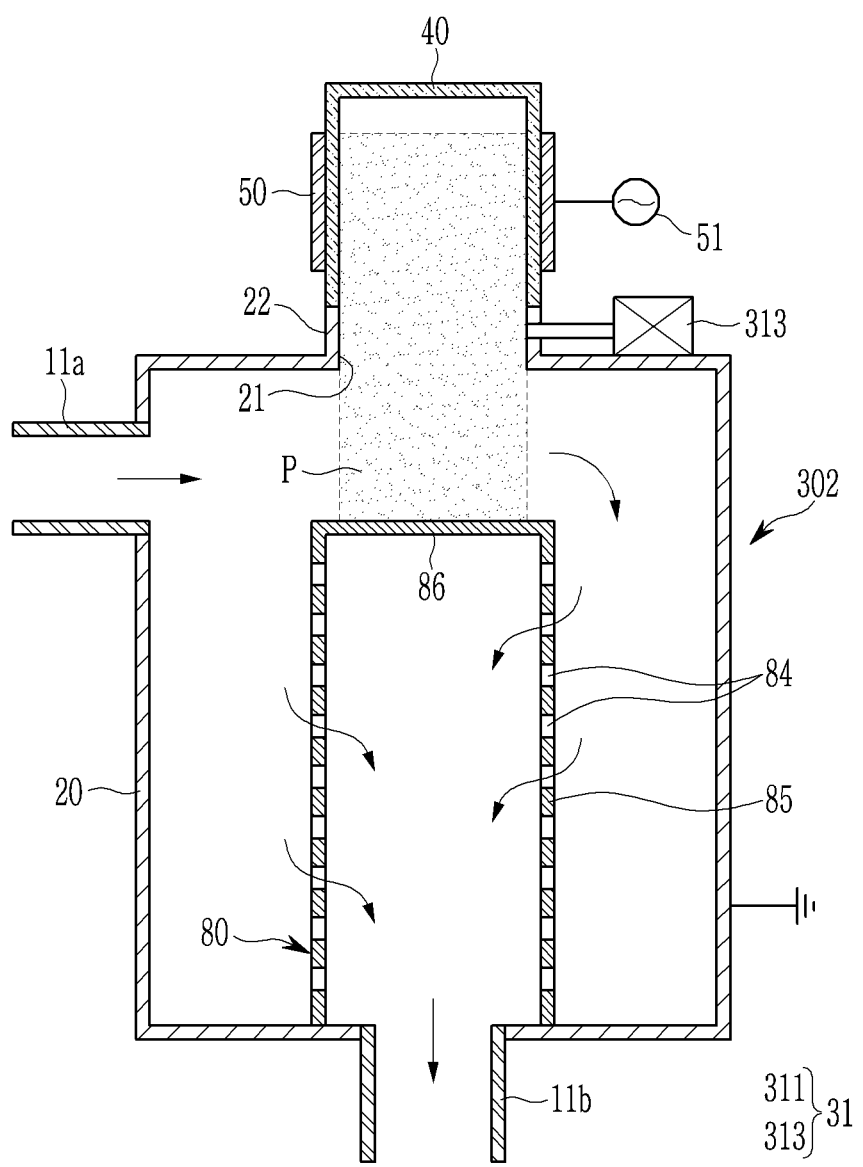

FIG. 29 and FIG. 30 illustrate cross-sectional views of a plasma cleaning apparatus according to an eleventh embodiment of the present invention.

Referring to FIG. 29 and FIG. 30, in a plasma cleaning apparatus 302 of the eleventh embodiment, the metal chamber 20 may be cylindrical, and is connected to the inlet vacuum tube 11a at a side wall thereof and to the outlet vacuum tube 11b at a lower center thereof.

The trap 80 may include a tubular portion 85 provided with a plurality of eighth openings 84 for passing the process gas, and a cover plate 86 blocking an upper end of the tubular portion 85. A lower end of the tubular portion 85 is fixed to the lower center of the metal chamber 20 so that the inner space of the trap 80 communicates with the outlet vacuum tube 11b. A height of the trap 80 is smaller than that of the metal chamber 20, and an inner diameter of the tubular portion 85 may be equal to or greater than that of the outlet vacuum tube 11b.

The process gas introduced into the metal chamber 20 through the inlet vacuum tube 11a moves to the inside of the trap 80 through the plurality of eighth openings 84 and is then discharged to the outlet vacuum tube 11b. In this process, undecomposed precursors and process by-products in the process gas collide with and are trapped by an upper portion of the cover plate 86, an outer surface of the tubular portion 85, and a bottom surface of the metal chamber 20, and then are continuously accumulated thereon.

The first opening 21 may be positioned at an upper center of the metal chamber 20 facing the cover plate 86, and the metal chamber 20 may include a second flange 22 surrounding the first opening 21 and extending upward. The dielectric 40 may be a tubular member with one side opened and the other side blocked, and is coupled to the second flange 22 such that an inner space thereof communicates with the first opening 21. The high voltage electrode 50 may be formed in a tubular shape surrounding the dielectric 40.

The gate 31 may include the gate plate 311 formed in a plate shape corresponding to the first opening 21 and the actuator 313 coupled to the gate plate 311. The gate 31 may be coupled to the second flange 22, and the actuator 313 may be a linear transfer motor. A first position of the gate plate 311 blocking the first opening 21 and a second position of the gate plate 311 opening the first opening 21 are switchable with each other.

In the deposition step of the process chamber, the gate plate 311 maintains the first position, and the process gas flowing into the metal chamber 20 is blocked by the gate plate 311 to not flow into the dielectric 40. Therefore, it is possible to prevent the metal component of the process gas from being applied to the dielectric 40.

In the cleaning step of the process chamber, the gate plate 311 maintains the second position, and a driving voltage is applied to the high voltage electrode 50. Thus, plasma P is generated in a space between the cover plate 86 and the dielectric 40, and the plasma P diffuses downward toward the trap 80. The cleaning gas is decomposed by the plasma P to generate fluorine radicals or chlorine radicals having excellent cleaning ability, and these radicals gasify the process by-products accumulated in the trap 80 and its surroundings.

As described above, the plasma cleaning apparatuses of the tenth and eleventh embodiments are the trap-integrated cleaning apparatuses, which may trap the process by-products by using the traps and at the same time plasma-clean the process by-products accumulated in the traps. Therefore, the plasma cleaning apparatus may lengthen the replacement cycle by increasing the service lifespan, and increase the semiconductor process efficiency.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS 101, 102: semiconductor process equipment
10: process chamber
11: vacuum tube
12: vacuum pump 13: trap apparatus
14: heater
201, 202, 203, 204, 205, 206, 207, 208, 209, 301, 302: plasma cleaning apparatus
20: metal chamber
30: gate assembly
31: gate
32: gate support
40: dielectric
50: high voltage electrode
60: cleaning gas injection pipe
70: ground electrode
80: trap

What is claimed is:

1. A plasma cleaning apparatus comprising:
a metal chamber connected between a vacuum tube of a process chamber and a vacuum pump and having a first opening formed on one surface of the metal chamber;
a gate assembly including a gate support fixed to the outside of the metal chamber around the first opening, the gate support having a second opening, and a gate coupled to the gate support and having a first position closing the second opening and a second position opening the second opening, the first position and the second position are switchable with each other;
a dielectric coupled to the outside of the gate support around the second opening; and
a high voltage electrode positioned on an outer surface of the dielectric,
the gate assembly includes a gate plate positioned inside the gate support,
the gate plate is grounded so that the gate plate functions as a ground electrode at the second position,
wherein when the gate is at the second position, a driving voltage is applied to the high voltage electrode such that plasma cleaning is performed.

2. The plasma cleaning apparatus of claim 1, wherein
the gate support is a plate-shaped member,
the second opening is positioned at a center of the plate-shaped member, and
a plurality of transfer rods fixed to the gate plate and penetrating the gate support, and an actuator coupled to at least one of the plurality of transfer rods.

3. The plasma cleaning apparatus of claim 2, wherein
the gate plate is larger than the second opening,
the plurality of transfer rods maintain a sealed state of the gate plate with respect to the gate support in the first position.

4. The plasma cleaning apparatus of claim 3, wherein
the dielectric includes a tubular first dielectric fixed to the gate support, and a plate-shaped second dielectric blocking an end portion of the first dielectric, and
the high voltage electrode is a tubular member surrounding the first dielectric.

5. Semiconductor process equipment including the plasma cleaning apparatus according to claim 1, the semiconductor process equipment comprising:
a process chamber for a deposition process to proceed; and
a vacuum pump connected to the process chamber by a vacuum tube and exhausting the inside of the process chamber,
wherein the plasma cleaning apparatus is connected to the vacuum tube, and decomposes cleaning gas into plasma to clean an undecomposed precursor and a process by-product accumulated in the vacuum tube and the vacuum pump.

* * * * *